(12) United States Patent  (10) Patent No.: US 9,362,524 B2
Mori  (45) Date of Patent: Jun. 7, 2016

(54) METHOD FOR PRODUCING GAS BARRIER FILM, GAS BARRIER FILM, AND ELECTRONIC DEVICE

(75) Inventor: Takahiro Mori, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 246 days.

(21) Appl. No.: 13/976,238

(22) PCT Filed: Dec. 7, 2011

(86) PCT No.: PCT/JP2011/078327
§ 371 (c)(1),
(2), (4) Date: Jun. 26, 2013

(87) PCT Pub. No.: WO2012/090665
PCT Pub. Date: Jul. 5, 2012

(65) Prior Publication Data
US 2013/0316182 A1 Nov. 28, 2013

(30) Foreign Application Priority Data
Dec. 27, 2010 (JP) .................................. 2010-289189

(51) Int. Cl.
*B05D 1/00* (2006.01)
*H01L 51/52* (2006.01)
(Continued)

(52) U.S. Cl.
CPC .............. *H01L 51/5253* (2013.01); *B05D 1/60* (2013.01); *C23C 16/0272* (2013.01); *C23C 16/402* (2013.01); *C23C 16/50* (2013.01); *C23C 16/545* (2013.01); *H01L 51/524* (2013.01)

(58) Field of Classification Search
CPC .... B05D 1/60; C23C 16/0272; C23C 16/402; C23C 16/50; C23C 16/545
See application file for complete search history.

(56) References Cited

U.S. PATENT DOCUMENTS 5,614,271 A  3/1997  Shibuya
5,986,032 A * 11/1999  Keller et al. ...................... 528/5
(Continued)

FOREIGN PATENT DOCUMENTS

JP  08-281861 A  10/1996
JP  11-166157 A  6/1999
(Continued)

OTHER PUBLICATIONS

Japanese Office Action, Notification of Reasons for Refusal, Patent Application No. 2012-550801, Drafting Date: Oct. 30, 2014, Dispatch Date: Nov. 11, 2014 and English translation thereof (total of 6 pages).

(Continued)

*Primary Examiner* — Dah-Wei D Yuan
*Assistant Examiner* — Kristen A Dagenais
(74) *Attorney, Agent, or Firm* — Lucas & Mercanti, LLP

(57) ABSTRACT

An object of the present invention is to provide a method for producing a gas barrier film, capable of producing a gas barrier film which has production suitability in a roll-to-roll manner and is excellent in productivity and in gas barrier performance. The method for producing a gas barrier film including: a coating step for coating a first barrier layer formed on a base with a coating liquid containing a polysilazane compound to form a coating film; and an ultraviolet ray irradiation step for irradiation with a vacuum ultraviolet ray by light sources to form a second barrier layer, wherein an illuminance of the vacuum ultraviolet ray received on a coating film surface by the coating film from start to end of the irradiation with the vacuum ultraviolet ray is 160 mW/cm$^2$ or less, there is a period T during which an illuminance of the vacuum ultraviolet ray on the coating film surface is 50 mW/cm$^2$ or more and 160 mW/cm$^2$ or less, and an amount of energy (E1) received on the coating film surface within T is 180 mJ/cm$^2$ or more and 1800 mJ/cm$^2$ or less.

6 Claims, 17 Drawing Sheets

(51) Int. Cl.
*C23C 16/02* (2006.01)
*C23C 16/40* (2006.01)
*C23C 16/50* (2006.01)
*C23C 16/54* (2006.01)

(56) References Cited

U.S. PATENT DOCUMENTS

2009/0110896 A1    4/2009  Kuramachi
2009/0167164 A1*   7/2009  Fukuda et al. ............. 313/504
2010/0166977 A1*   7/2010  Brand et al. ............... 427/515

FOREIGN PATENT DOCUMENTS

| JP | 3511325 B2    | 1/2004  |
| JP | 2008-235165 A | 10/2008 |
| JP | 2009-503157 A | 1/2009  |
| JP | 2009-255040 A | 11/2009 |
| WO | WO 2007/012392 A2   | 2/2007 |
| WO | WO 2007012392 A2 *  | 2/2007 |
| WO | WO 2011/007543 A1   | 1/2011 |
| WO | WO 2012/008277 A1   | 1/2012 |
| WO | WO 2012/014653 A1   | 2/2012 |

OTHER PUBLICATIONS

Database WPI, Week 200876, Thomson Scientific, London, GB; AN 2008-M90397, XP002724731, and JP 2008-235165A (Konica Corp). Oct. 2, 2008 abstract.
Supplemental European Search Report, EP 11-85-4188, Dated: Jun. 4, 2014 (7 pages).
Leibniz Institute of Surface Modification Biannual Report; 2008-2009; pp. 18-21.
International Search Report of PCT/JP2011/078327 dated Mar. 13, 2012.
IPRP and translation thereof, date of issuance of report Jul. 2, 2013.

* cited by examiner

METHOD FOR PRODUCING GAS BARRIER FILM, GAS BARRIER FILM, AND ELECTRONIC DEVICE

CROSS REFERENCE TO RELATED APPLICATION

This Application is a 371 of PCT/JP2011/078327 filed on Dec. 7, 2011, which claimed the priority of Japanese Patent Application No. 2010-289189 filed on Dec. 27, 2010, both applications are incorporated herein by reference in their entirety.

BACKGROUND

1. Technical Field

The present invention relates to gas barrier films and methods for producing the gas barrier films. More specifically, the present invention relates to a gas barrier film used in a package generally for an electronic device or the like, or in an organic electroluminescence (EL) element, a solar cell element, a liquid crystal display element, or the like and to a method for producing the gas barrier film.

2. Description of Related Arts

Conventionally, gas barrier films formed by laminating a plurality of layers containing thin films of metallic oxides such as aluminum oxide, magnesium oxide, and silicon oxide on plastic substrate and film surfaces have been widely used for packaging articles needing to be shielded against various gases, such as moisture vapor and oxygen, and for packaging applications for preventing change in quality of food products, industrial products, pharmaceutical products, and the like.

In addition to packaging applications, they have been used in solar cell elements, organic electroluminescence (EL) elements, liquid crystal display elements, and the like.

As a method for forming such a gas barrier film, there has been known a gas phase method such as a chemical deposition method (plasma CVD method: Chemical Vapor Deposition) by which a film is formed on a substrate while oxidizing an organosilicon compound represented by tetraethoxysilane (TEOS) by oxygen plasma under reduced pressure or a physical deposition method (vacuum deposition method or sputtering method) by which metallic Si is evaporated to deposit a gas barrier layer on a substrate using a semiconductor laser in the presence of oxygen.

These methods have been preferably used for forming metal oxide thin films including $SiO_2$ since a thin film with accurate composition can be formed on a substrate; however, they have had significantly poor productivity in view of the fact that reduction in pressure and atmospheric opening in a film production apparatus need time due to the formation of the films under reduced pressure and in view of the fact that decrease in film production rate is needed for obtaining dense film quality providing a good gas barrier property since poor film quality with many defects is caused by increasing a film production rate.

An attempt to form a silicon oxide thin film by coating a silicon-containing compound to modify the coating film has been made for the purpose of improving productivity to solve such problems, and the examination has been also carried out for gas barrier films.

There has been generally known a technology to form a silicon oxide film which can be produced in a solution process by a method called a sol-gel process with an alkoxide compound as a source material. In the sol-gel process, heating at high temperature is generally necessary and a large volume shrinkage farther occurs in the process of a dehydrative condensation reaction to generate a large number of defects in the film.

Although there has been known a procedure of mixing a source material solution with organic substances which are not directly involved in formation of oxides to prevent this problem, a barrier property is deteriorated to cause an insufficient barrier property in view of the whole film due to the remaining of these organic substances in the film.

Based on them, it has been difficult to use an oxide film produced in the sol-gel process as a protection film for a flexible electronic device directly.

As another method, there has been proposed formation of a silicon oxide film using, as a source material, a silazane compound having a silazane structure (Si—N) as a basic structure.

It has been known that, since the reaction in this case is not dehydrative condensation polymerization but a direct substitution reaction from nitrogen to oxygen, a mass yield before and after the reaction is as high as 80% to 100% and a dense film with a few defects in the film due to volume shrinkage is obtained.

However, the formation of the silicon oxide film by the substitution reaction of the silazane compound requires a high temperature of 450° C. or more and it was not able to be adapted to a flexible substrate such as a plastic.

As means for solving such a problem, there has been proposed a method for forming a silicon oxide film by irradiating a coating film formed by coating from a solution containing a silazane compound and a compound releasing amines, with vacuum-ultraviolet light (see Patent Literature 1).

The silicon oxide film can be formed at a comparatively low temperature by making an oxidation reaction due to active oxygen or ozone proceed while directly cutting an atomic bond by the action only of a photon, referred to as a light quantum process, by using larger light energy with 100 to 200 nm, referred to as vacuum-ultraviolet light (hereinafter also described as "VUV" or "VUV light"), than interatomic bonding force in a silazane compound.

Further, it is necessary to enable continuous production industrially in so-called roll-to-roll from the viewpoint of the production of a gas barrier film.

In addition, there have been known methods of transporting a film at a rate of around 1 m/min or 10 m/min and irradiating a silazane compound coating film with an excimer lamp to produce a gas barrier film, as methods for the production in roll-to-roll (see Patent Literature 2 and Hon Patent Literature 1).

However, these methods also have had such problems that productivity is insufficient and the barrier performance of the produced gas barrier film is quite insufficient for a gas barrier layer for an organic photoelectric conversion element or the like.

On the other hand, there has been, also examined that a composite-type gas barrier layer in which a gas barrier layer formed by coating is laminated on a gas barrier layer formed by a gas phase method such as CVD or sputtering. It has been examined for the purpose of repairing the defect of the gas barrier layer, formed by the gas phase method, by the gas barrier layer formed by the coating, and has the possibility of obtaining a good gas barrier property while increasing the productivity of the gas barrier layer formed by the gas phase method.

For example, Patent Literature 3 discloses a method of further improving barrier performance by laminating and coating polysilazane on a gas barrier layer formed on a resin base by a vacuum plasma CVD method and by repairing the gas barrier layer by heat treatment. However, the gas barrier layer obtained by this method has been insufficient as a gas barrier layer for an organic photoelectric conversion element or the like and has been significantly poor in productivity since the heat treatment of polysilazane at 160° C. for as long as 1 hour is needed.

As described above, there has been demanded a method for producing a gas barrier film enabling compatibility between a very high barrier property required by an organic photoelectric conversion element or the like and productivity.

CITATION LIST

Patent Literature

Patent Literature 1: Japanese Patent Laid-Open No. 11-166157
Patent Literature 2: National Publication of International Patent Application No. 2009-503157 (International Publication No. WO 2007/012392)
Patent Literature 3: U.S. Pat. No. 3,511,325

Non Patent Literature

Non Patent Literature 1: Leibniz Institute of Surface Modification Biannual Report 2008/2009: P18-P21

SUMMARY

Technical Problem

The present invention is accomplished with respect to the above-described problems and circumstances, and a problem to be solved is to provide a method for producing a gas barrier film, capable of producing a gas barrier film which has production suitability in a roll-to-roll manner and is excellent in gas barrier performance; a gas barrier film obtained thereby; and an electronic device in which the gas barrier film is used.

Solution to Problem

The above-described problem according to the present invention is solved by the following means.

1. A method for producing a gas barrier film, whereby a gas barrier film which has a first gas barrier layer formed on a base by a chemical vapor deposition method and has a second gas barrier layer on the first gas barrier layer is produced, the method including: a coating step for coating the first gas barrier layer formed on the belt-shaped base with a coating liquid containing a polysilazane compound to form a coating film; and an ultraviolet ray irradiation step for using a plurality of light sources of a vacuum ultraviolet ray (VUV) which face the base and have a distribution of an illuminance within ±10% on a straight line from one point of a first side to one point of a second side along the longitudinal direction of the base, moving the base, on which the coating film is formed, relatively with respect to the light sources, and irradiating the coating film with a vacuum ultraviolet ray to form the second gas barrier layer, wherein, in the ultraviolet ray irradiation step, an illuminance of the vacuum ultraviolet ray received on a coating film surface by the coating film which moves relatively with respect to the light sources from start to end of the irradiation with the vacuum ultraviolet ray, is 160 mW/cm² or less, there is a period T during which an illuminance of the vacuum ultraviolet ray on the coating film surface is 50 mW/cm² or more and 160 mW/cm² or less, and an amount of energy (E1) of a vacuum ultraviolet ray received on the coating film surface within the period T is 180 mJ/cm² or more and 1800 mJ/cm² or less.

2. The method for producing a gas barrier film according to 1 described above, wherein, in the ultraviolet ray irradiation step, a ratio (E2/E1) of an amount of energy (E2) of a vacuum ultraviolet ray received on the coating film surface during a period other than the period T to the E1 is 0 or more and 0.25 or less.

3. The method for producing a gas barrier film according to 1 or 2 described above, wherein a rate of time of the period T to time of a total period Z in the ultraviolet ray irradiation step is 30% or more.

4. The method for producing a gas barrier film according to 3 described above, wherein a rate of time of the period T to time of a total period Z in the ultraviolet ray irradiation step is 70% or more.

5. The method for producing a gas barrier film according to 4 described above, wherein the period T is just one in the ultraviolet ray irradiation step.

6. A gas barrier film produced by the method for producing a gas barrier film according to any one of 1 to 5 described above.

7. An electronic device including the gas barrier film according to 6 described above.

Advantageous Effects of Invention

By the above-described means of the present invention, there can be provided a method for producing a gas barrier film, capable of producing a gas barrier film which has production suitability in a roll-to-roll manner and is excellent in productivity and in gas barrier performance; and a gas barrier film obtained thereby.

DETAILED DESCRIPTION

Figure 1:
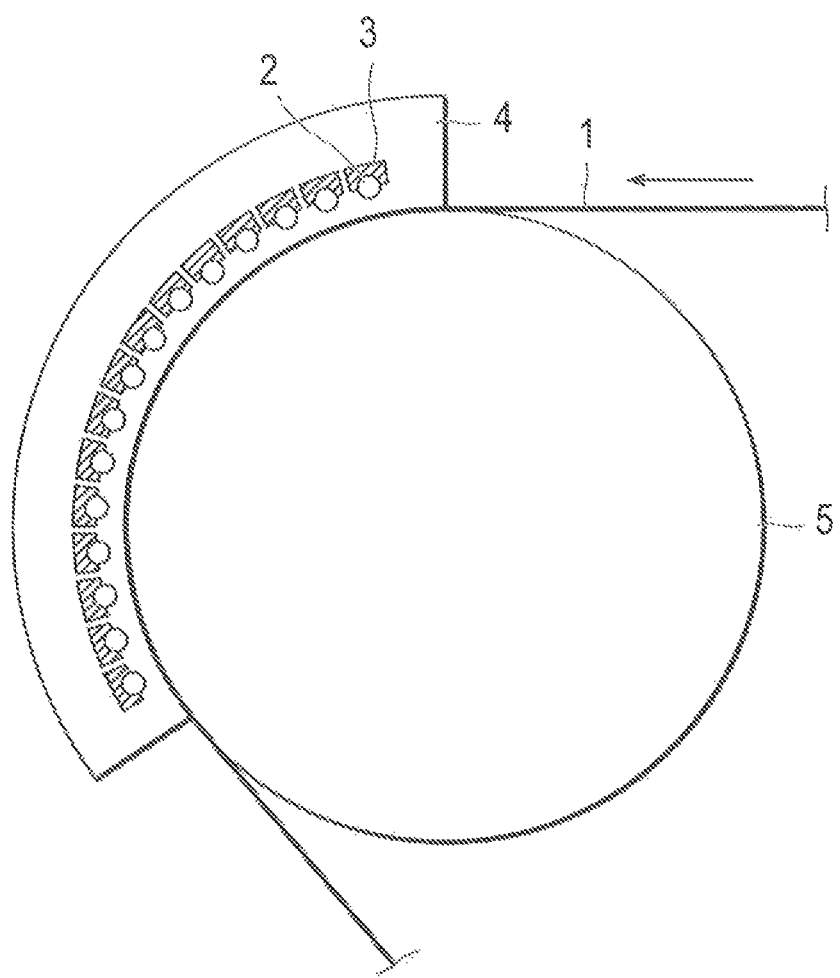
FIG. 1 is a schematic cross-sectional view of an example of a vacuum ultraviolet ray irradiation apparatus used in the production method of the present invention.
Figure 2:
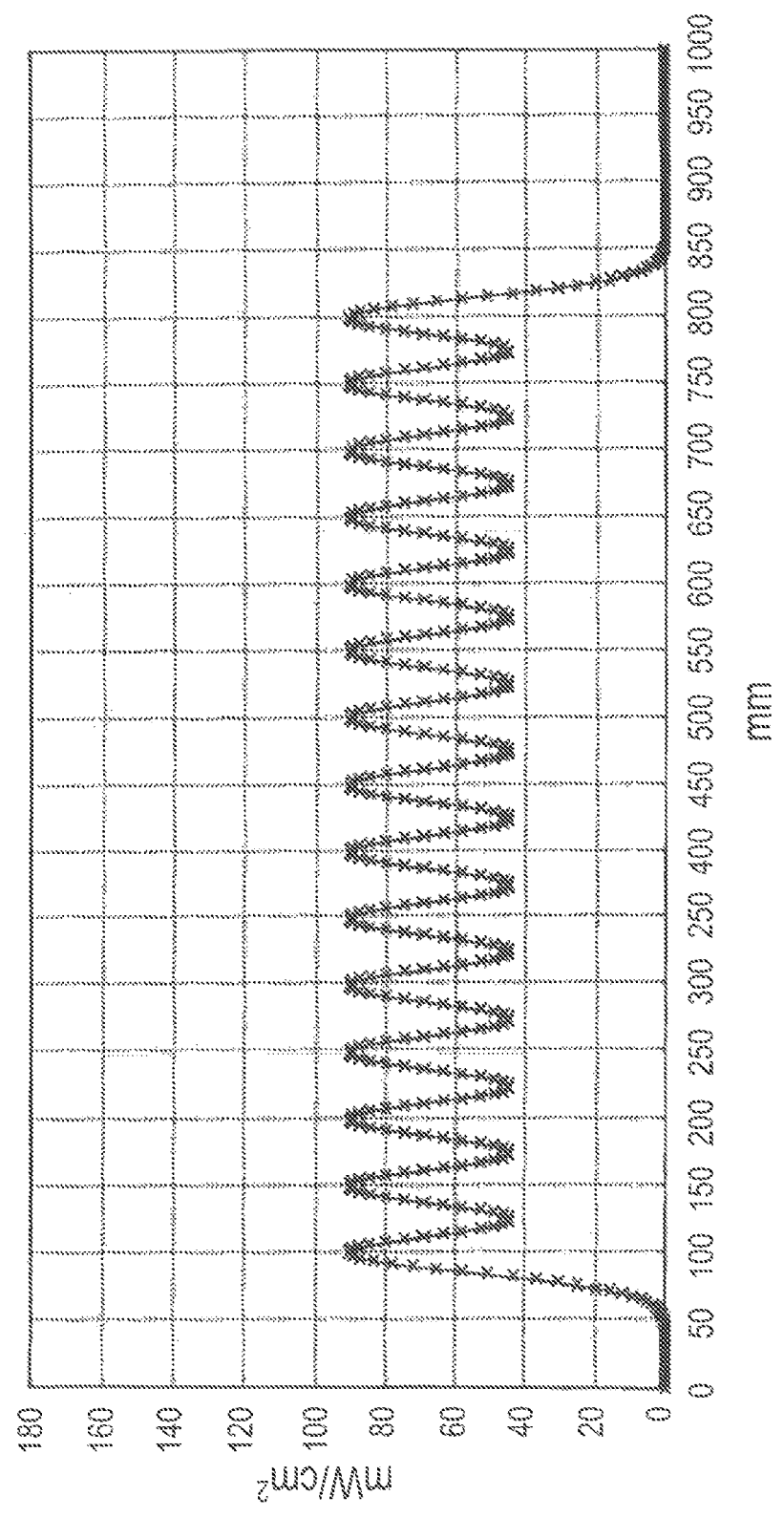
FIG. 2 is a view indicating an example (pattern A) of variation in illuminance received on a coating film surface in the ultraviolet ray irradiation step over time.

A method for producing a gas barrier film, whereby a gas barrier film which has a first gas barrier layer formed on a base by a chemical vapor deposition method and has a second gas barrier layer on the first gas barrier layer is produced, the method including: a coating step for coating the first gas barrier layer formed on the belt-shaped base with a coating liquid containing a polysilazane compound to form a coating film; and an ultraviolet ray irradiation step for using a plurality of light sources of a vacuum ultraviolet ray (VUV) which face the base and have a uniform illuminance in the widthwise direction of the base, moving the base, on which the coating film is formed, relatively with respect to the light sources, and irradiating the coating film with a vacuum ultraviolet ray to form the second gas barrier layer, wherein, in the ultraviolet ray irradiation step, an illuminance of the vacuum ultraviolet ray received on a coating film surface by the coating film which moves relatively with respect to the light sources from start to end of the irradiation with the vacuum ultraviolet ray, is 160 mW/cm$^2$ or less, there is a period T during which an illuminance of the vacuum ultraviolet ray on the coating film surface is 50 mW/cm$^2$ or more and 160 mW/cm$^2$ or less, and an amount of energy (E1) of a vacuum ultraviolet ray received on the coating film surface within the period T is 180 mJ/cm$^2$ or more and 1800 mJ/cm$^2$ or less.

In accordance with the present invention, a gas barrier film excellent in gas barrier performance by a method of irradiation with a certain amount of vacuum ultraviolet rays having the specified irradiation intensity described above can be particularly produced with high productivity.

Now, a detailed description is made of the components of the gas barrier film produced by the production method of the present invention.

<<Gas Barrier Film>>

The gas barrier film according to the present invention has a first gas barrier layer formed on a base by a chemical vapor deposition method and has a second gas barrier layer on the first gas barrier layer. In addition, as used herein, unless otherwise specified, the concept of "has a second gas barrier layer on the first gas barrier layer" includes both of (1) the form of disposing the second gas barrier layer directly in contact with the first gas barrier layer; and (2) the form of disposing the second gas barrier layer on the first gas barrier layer via another layer.

The gas barrier film according to the present invention may further have a gas barrier layer similar to the first gas barrier layer on the second gas barrier layer and may further have a gas barrier layer similar to the second gas barrier layer thereon.

Further, it may have a gas barrier layer similar to the first gas barrier layer on the side opposite to the surface, having the first and second gas barrier layers, of the base, and may have a gas barrier layer similar to the second gas barrier layer thereon.

[Base]

The base used in the method for producing a gas barrier film of the present invention is a long support, capable of holding a gas barrier layer (also simply referred to as "barrier layer") having a gas barrier property mentioned below (also simply referred to as "barrier property"). The base is specifically formed of such materials as described below without particular limitation thereto.

Examples may include each resin film of an acrylic acid ester, a methacrylic acid ester, polyethylene terephthalate (PET), polybutylene terephthalate, polyethylene naphthalate (PEN), polycarbonate (PC), polyarylate, polyvinyl chloride (PVC), polyethylene (PE), polypropylene (PP), polystyrene (PS), nylon (Ny), aromatic polyamide, polyether ether ketone, polysulfone, polyether sulfone, polyimide, polyetherimide, or the like; a heat-resistant transparent film containing silsesquioxane having an organic-inorganic hybrid structure as a basic skeleton (e.g., product name Sila-DEC, manufactured by Chisso Corporation; product name SILPLUS, manufactured, by Nippon Steel Chemical Co., Ltd.; or the like); and, in addition, resin films constituted by laminating two or more layers of the resins.

With respect to the cost or the ease of acquisition, polyethylene terephthalate (PET), polybutylene terephthalate, polyethylene naphthalate (PEN), polycarbonate (PC), and the like are preferably used; and, further, with respect to optical transparency, heat resistance, and adhesiveness between the inorganic layer and the gas barrier layer, a heat-resistant transparent film containing silsesquioxane having an organic-inorganic hybrid structure as a basic skeleton is preferably used.

On the other hand, process temperature may be more than 200° C. in an array production step, for example, when a gas barrier film is used for applications of electronic devices such as flexible displays. There is a concern that, in the case of production by roll-to-roll, since tensile force to a certain degree is always applied to a base, when the base is placed under high temperature to increase the temperature of the base to cause the temperature of the base to be more than a glass transition point temperature, the elastic modulus of the base is sharply decreased to extend the base due to the tensile force and a gas barrier layer is damaged.

Accordingly, a heat-resistant material having a glass transition point of 150° C. or more is preferably used as the base in such an application. That is, it is preferable to use polyimide, polyetherimide, or a heat-resistant transparent film with silsesquioxane having an organic-inorganic hybrid structure as a basic skeleton. However, there is a concern that the heat-resistant resin represented thereby, because of being noncrystalline, has a high water absorption percentage, compared with PET or PEN which is crystalline, to result in greater dimensional change of the base due to humidity, and a gas barrier layer is damaged.

However, even when these heat-resistant materials are used for the base, the formation of gas barrier layers or gas barrier layer units (layers including a plurality of gas barrier layers) on both surfaces can result in suppression of dimensional change due to moisture absorption and desorption by a base film in itself under severe conditions of nigh temperature and high humidity and damage to the gas barrier layers. Accordingly, it is one of more preferred embodiments that a heat-resistant material is used for the base and the gas barrier layers or the gas barrier layer units are formed on both surfaces.

The thickness of the base is preferably around 5 μm to 500 μm, further preferably 25 to 250 μm.

Further, the base is preferably transparent.

Here, a base being transparent means that the light transmittance of visible light (400 to 700 μm) is 80% or more.

This is because the base which is transparent and a layer formed on the base which is also transparent enable a transparent gas barrier film to be made and therefore also a transparent substrate for an organic EL element or the like to be made.

Further, the base employing any resin as mentioned above may be a non-stretched film or a stretched film.

The base used in the present invention can be produced by a common method known in the art. For example, a substantially amorphous, non-oriented, and non-stretched base can be produced by melting a resin as a material in an extruder and extruding the melt through a ring die or a T-die to quench the melt.

Further, a stretched base may be produced by stretching a non-stretched base in a base flow (longitudinal axis) direction or a direction perpendicular (transverse axis) to the base flow direction by a known method such as uniaxial stretching, tenter-type sequential biaxial stretchings tenter-type simultaneous biaxial stretching, or tubular simultaneous biaxial stretching.

The draw ratio in this case is preferably 2 to 10 times in each of the longitudinal axis direction and the transverse axis direction, although the draw ratio may be appropriately selected in accordance with the resin as a raw material of the base.

Furthermore, it is preferable to carry out relaxation treatment after stretching in order to improve the dimensional stability of the substrate in the stretched film.

Further, the base according to the present invention may also be subjected to corona treatment prior to forming a coating film. Furthermore, an anchor coat agent layer may also be formed on the surface, on which the coating film is formed, of the base according to the present invention, for the purpose of improving adhesiveness with the costing film.

<<Anchor Coat Agent Layer>>

Examples of anchor coat agents used for the anchor coat agent layer include polyester resins, isocyanate resins, urethane resins, acrylic resins, ethylene vinyl alcohol resins, vinyl modified resins, epoxy resins, modified styrene resins, modified silicon resins, alkyl titanate, and the like, which may be used singly or in combination of two or more kinds thereof.

An additive known in the art can also be added to these anchor coat agents. In addition, the anchor coating may be performed by coating such an anchor coat agent as described above on a support by a known method, such as roll coat, gravure coat, knife coat, dip coat, or spray coat, and drying to remove a solvent, a diluent, and the like. The amount of the coated anchor coat agent as described above is preferably around 0.1 g/m$^2$ to 5 g/m$^2$ (in a dry state).

<<Smooth Layer>>

The gas barrier film of the present invention may also include a smooth layer between the base and the gas barrier layer unit. The smooth layer used in she present invention is disposed in order to flatten the roughened surface of a transparent resin film support, on which projections and/or the like are present, or to fill and flatten recesses and projections or pinholes generated in the transparent inorganic compound layer by the projections present on the transparent resin film support. Such a smooth layer is basically formed by curing a photosensitive material or a thermosetting material.

Examples of the photosensitive material used in the smooth layer include a resin composition comprising an acrylate compound having a radical reactive unsaturated group; a resin composition comprising an acrylate compound and a mercapto compound having a thiol group; a resin composition in which a polyfunctional acrylate monomer such as epoxy acrylate, urethane acrylate, polyester acrylate, polyether acrylate, polyethylene glycol acrylate, or glycerol methacrylate is dissolved; and the like. Such resin compositions as described above may also be optionally mixed and used and is not particularly limited as long as the mixture is a photosensitive resin containing a reactive monomer having one or more photopolymerizable unsaturated bonds in a molecule.

Specific examples of the thermosetting material-include tutoProm series (organic polysilazane) manufactured by Clariant, SP COAT heat-resistant clear coating manufactured by Ceramic Coat Co., Ltd., nanohybrid silicone manufactured by ADEKA Corporation, UNIDIC V-8000 Series, EPICLON EXA-4710 (super-high-heat-resistant epoxy resin), manufactured by DIC Corporation, various silicon resins manufactured by Shin-Etsu Chemical Co., Ltd., inorganic/organic nanocomposite material SSG coat manufactured by Nitto Boseki Co., Ltd., thermosetting urethane resins comprising acrylic polyols and isocyanate prepolymers, phenolic resins, urea melamine resins, epoxy resins, unsaturated polyester resins, silicon resins, and the like. Among them, epoxy resin-based materials having heat resistance are particularly preferred.

The method for forming a smooth layer is not particularly limited, however, the formation is preferably performed by wet coating methods such as spray coating methods, blade coating methods, and dip coating methods, and dry coating methods such as vapor deposition methods.

In the formation of the smooth layer, an additive such as an oxidation inhibitor, an ultraviolet ray absorber, or a plasticizer may be optionally added to the above-mentioned photosensitive resin. A resin or an additive suitable for improving the film forming property or for preventing occurrence of pinholes may also be used in any smooth layer irrespective of the laminate position of the smooth layer.

As the smoothness of the smooth layer, a maximum cross-sectional height Rt(p), which is a value represented by surface roughness specified in JIS B 0601, is preferably 10 nm or more and 30 nm or less. When the value is 10 or more, there is no concern that a coating property is deteriorated when coating means contacts with the surface of the smooth layer in a coating manner with a wire bar, a wireless bar, or the like in the step of coating a silicon compound described below. Further, when the value is 30 nm or less, it may be easy to smooth recesses and projections after coating the silicon compound.

<<Bleedout Preventing Layer>>

The gas barrier film according to the present invention may also have a bleedout preventing layer on the side opposite to the smooth layer of the base.

The bleedout preventing layer is disposed on the surface opposite to the surface of the base having the smooth layer for the purpose of inhibiting the phenomenon of the contamination of the contact surface due to the migration of an unreacted oligomer and/or the like from the inside of the film support to the surface, when the film having the smooth layer is heated. As long as the bleedout preventing layer has this function, the bleedout preventing layer may have the same constitution as that of the smooth layer.

As an unsaturated organic compound having a polymerizable unsaturated group, which may be incorporated into the bleedout preventing layer, mention may be made of Si polyvalent unsaturated organic compound having two or more polymerizable unsaturated groups in the molecule or a mono unsaturated organic compound having one polymerizable unsaturated group in the molecule.

As other additive agents, a matting agent may be incorporated. As a matting agent, inorganic particles having an average particle diameter of around 0.1 to 5 μm are preferred. As such inorganic particles, one kind or two or more kinds in combination of silica, alumina, talc, clay, calcium carbonate, magnesium carbonate, barium sulfate, aluminum hydroxide, titanium dioxide, zirconium dioxide, and the like may be used.

The matting agent containing inorganic particles is desirably contained in a rate of 2 parts by mass or more, preferably 4 parts by mass or mere, and more preferably 6 parts by mass or more, but 20 parts by mass or less, preferably 18 parts by mass or less, and more preferably 16 parts by mass or less, based on 100 parts by mass of the solid content of the above-mentioned unsaturated organic compound (hard coat agent).

In the bleedout preventing layer, a thermoplastic resin, a thermosetting resin, an ionizing radiation curable resin, a photopolymerization initiator, or the like may also be incorporated as another component except the unsaturated organic compound (hard coat agent) and the matting agent.

Such a bleedout preventing layer as described above can be formed by preparing a coating liquid by blending a hard coat agent, a matting agent, and optionally another component with an appropriately optionally used diluting solvent, coating the coating liquid on the surface of the support film by a coating method known in the art, and thereafter irradiating the liquid with ionizing radiation to cure the liquid.

A method for irradiation with ionizing radiation can be performed by irradiation with ultraviolet rays in a wavelength region of 100 to 400 nm, preferably 200 to 400 nm, emitted from an ultra-high-pressure mercury lamp, a nigh-pressure mercury lamp, a low-pressure mercury lamp, a carbon arc, a metal halide lamp, or the like, or by irradiation with electron beams in a wavelength region of 100 nm or less, emitted from a scanning- or curtain-type electron beam accelerator.

The thickness of a bleedout preventing layer is 1 to 10 μm and preferably 2 μm to 7 μm, in view of improving the heat resistance of a film, making it easy to adjust the balance in the optical property of a film, and preventing the curl in the case of disposing a bleedout preventing layer only on one surface of a gas barrier film.

[First Barrier Layer]

In accordance with the present invention, the first barrier layer is a barrier layer formed by a chemical vapor deposition method.

Generally, examples of methods of forming a functionalized thin film on a base mainly include physical vapor growth methods and chemical vapor growth methods (chemical vapor deposition methods). The physical vapor growth methods are methods of depositing a thin film of a substance of interest (for example, such as a carbon film) on a surface of a substance in a vapor phase by a physical procedure, and these methods are vapor deposition methods (resistance heating method, electron beam deposition method, molecular beam epitaxy method), ion plating methods, sputtering methods, and the like. On the other hand, the chemical vapor growth methods (chemical vapor deposition methods, Chemical Vapor Deposition) are methods of supplying a source gas containing the components of a thin film of interest onto a base to deposit a film by a chemical reaction on a substrate surface or in a vapor phase. Further, there are, e.g., methods of generating plasma for the purpose of activating a chemical reaction, examples thereof include known CVD manners such as heat CVD methods, catalytic chemical vapor growth methods, photo CVD methods, plasma CVD methods, and atmospheric pressure plasma CVD methods; and the like, and all thereof may be advantageously used in the present invention. Without particular limitation, a plasma CVD method is preferred from the viewpoint of a film production rate and a treatment area.

A plasma CVD method will be specifically described below.

Figure 16:
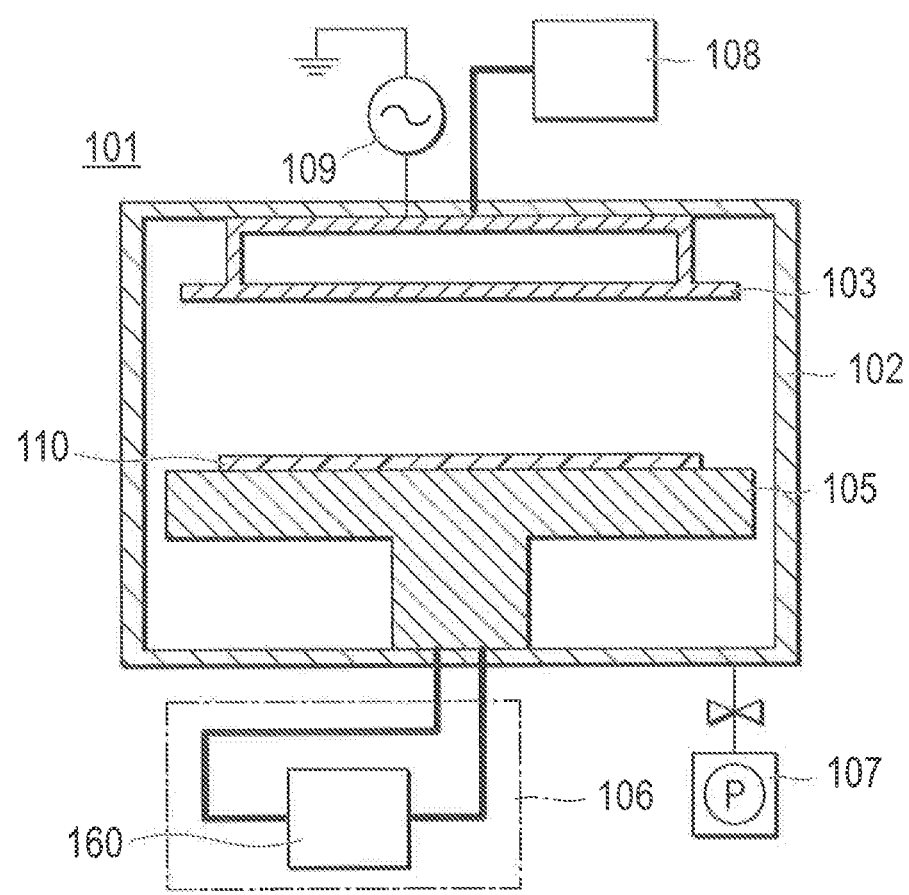
FIG. 16 is a schematic cross-sectional view illustrating an example of an apparatus used for forming a first gas barrier layer.

Reference numeral 101 in FIG. 16 denotes an example of a typical plasma CVD apparatus.

This plasma CVD apparatus 101 includes a vacuum tank 102 and a susceptor 105 is placed on the bottom surface side of the inside of the vacuum tank 102.

A cathode electrode 103 is placed at a position, facing the susceptor 105, on the ceiling side of the inside of the vacuum tank 102.

A heat medium circulating system 106, a vacuum pumping system 107, a gas introduction system 108, and a high frequency power source 109 are placed outside the vacuum tank 102.

A heat medium is placed in the heat medium circulating system 106.

A heating cooling apparatus 160 including a pump which moves the heat medium, a heating apparatus which heats the heat medium, a cooling apparatus which cools it, a temperature sensor with which the temperature of the heat medium is measured, and a memory apparatus which memorizes a set temperature for the heat medium is disposed in the heat medium circulating system 106.

The heating cooling apparatus 160 is constituted to measure the temperature of the heat medium, to heat or cool the heat medium to the memorized set temperature, and to supply the heat medium to the susceptor 105. The supplied heat medium flows into the susceptor 105, heats or cools the susceptor 105, and returns to the heating cooling apparatus 160. The temperature of the heat medium is higher or lower than the set temperature when this occurs, and the heating cooling apparatus 160 heats or cools the heat medium to the set temperature and supplies the heat medium to the susceptor 105. A cooling medium is circulated between the susceptor and the heating cooling apparatus 160 in this manner and the susceptor 105 is heated or cooled by the supplied heat medium at the set temperature.

The vacuum tank 102 is connected to the vacuum pumping system 107, and, prior to starting film formation treatment by the plasma CVD apparatus 101, the heat medium has been heated to increase its temperature from room temperature to the set temperature while preevacuating the inside of the vacuum tank 102 and the heat medium at the set temperature has been supplied to the susceptor 105. The susceptor 105 is at room temperature when beginning to be used and the supply of the heat medium at the set temperature results in increase in the temperature of the susceptor 105.

The heat medium at the set temperature is circulated for given time and a substrate 110 to be film-formed is thereafter conveyed into the vacuum tank 102 while maintaining vacuum atmosphere in the vacuum tank 102 and is placed on the susceptor 105.

A large number of nozzles (pore) are formed in the surface, facing the susceptor 105, of the cathode electrode 103.

The cathode electrode 103 is connected to the gas introduction system 108, and a CVD gas is spouted from the nozzles of the cathode electrode 103 into the vacuum tank 102 with vacuum atmosphere by introducing the CVD gas from the gas introduction system 108 into the cathode electrode 103.

The cathode electrode 103 is connected to the high frequency power source 109 and the susceptor 105 and the vacuum tank 102 are connected to a ground potential.

Plasma of the introduced CVD gas is formed by supplying the CVD gas from the gas introduction system 108 into the vacuum tank 102, starting the high frequency power source 109 while supplying the heat medium at given temperature from the heating cooling apparatus 160 to the susceptor 105, and applying a high-frequency voltage to the cathode electrode 103.

When the CVD gas activated in the plasma arrives at the surface of the substrate 110 on the susceptor 105, a thin film grows on the surface of the substrate 110.

During the growth of the thin film, the thin film is formed in the state where the heat medium at the given temperature has been supplied from the heating cooling apparatus 160 to the susceptor 105 and the susceptor 105 is heated or cooled by the heat medium, and maintained at given temperature. Generally, the lower limit temperature of growth temperature at which, the thin film is formed depends on the film quality of the thin film while the upper limit temperature thereof depends on the permissible range of damage to the thin film that has been already formed on the substrate 110.

The lower limit temperature and the upper limit temperature depend on the material quality of the thin film to be formed, the material quality of the thin film that has been already formed, and/or the like, and the lower limit temperature is 50° C. or more and the upper limit temperature is not more than the heat-resistant temperature of the base to secure the film quality when a SiN film or a SiON film, used in a high barrier film and/or the like, is formed.

The correlation between the film quality of the thin film formed by the plasma CVD method and film formation temperature and the correlation between damage to an article to be film-formed (substrate 110) and film formation temperature are predetermined to determine the lower limit temperature and the upper limit temperature. For example, during a plasma CVD process, the lower limit temperature of the substrate 110 is 50° C. and the upper limit temperature thereof is 250° C.

Furthermore, when a high-frequency voltage of 13.56 MHz or more is applied to the cathode electrode 103 to form plasma, the relationship between the temperature of the heat medium supplied to the susceptor 105 and the temperature of the substrate 110 has been premeasured and the temperature of the heat medium supplied to the susceptor 105 has been determined to maintain the temperature of the substrate 110 at the lower limit temperature or more and the upper limit temperature or less during the plasma CVD process.

For example, it is set to memorize the lower limit temperature (50° C. in this case) and to supply the heat medium, of which the temperature is controlled to the lower limit temperature or more, to the susceptor 105. The heat medium flowing back from the susceptor 105 is heated or cooled and the heat medium at the set temperature of 50° C. is supplied to the susceptor 105. For example, a mixed gas of silane gas and ammonia gas with nitrogen gas is supplied as the CVD gas to form a SiN film in the state where the temperature of the substrate 110 is maintained at the lower limit temperature or more and the upper limit temperature or less.

Immediately after starting the plasma CVD apparatus 101, the susceptor 105 is at room temperature and the temperature of the heat medium flowing back from the susceptor 105 to the heating cooling apparatus 160 is lower than the set temperature. Thus, immediately after the start, the heating cooling apparatus 160 heats the heat medium flowing back to increase its temperature to the set temperature and supplies the heat medium to the susceptor 105. In this case, the susceptor 105 and the substrate 110 are heated by the heat medium to increase its temperature and the substrate 110 is maintained in the range of the lower limit temperature or more and the upper limit temperature or less.

The temperature of the susceptor 105 is increased due to heat flowing in from plasma by consecutively forming thin films on a plurality of substrates 110. In this case, the heat medium flowing back from the susceptor 105 to the heating cooling apparatus 160 has higher temperature than the lower limit temperature (50° C.) and the heating cooling apparatus 160 therefore cools the heat medium and supplies the heat medium at the set temperature to the susceptor 105. As a result, the thin films can be formed while maintaining the substrates 110 in the range of the lower limit temperature or more and the upper limit temperature or less.

As described above, the heating cooling apparatus 160 heats the heat medium in the case in which the temperature of the heat medium flowing back is lower than the set temperature and cools the heat medium in the case in which the temperature thereof is higher than the set temperature, the heat medium at the set temperature is supplied to the susceptor in both cases, and the substrate 110 is therefore maintained in the temperature range of the lower limit temperature or more and the upper limit temperature or less.

After formation of the thin film with a predetermined film thickness, the substrate 110 is conveyed outside the vacuum tank 102, a substrate 110 on which no film has been formed is conveyed into the vacuum tank 102, and a thin film is formed while supplying the heat medium at the set temperature in the same manner as described above.

Figure 17:
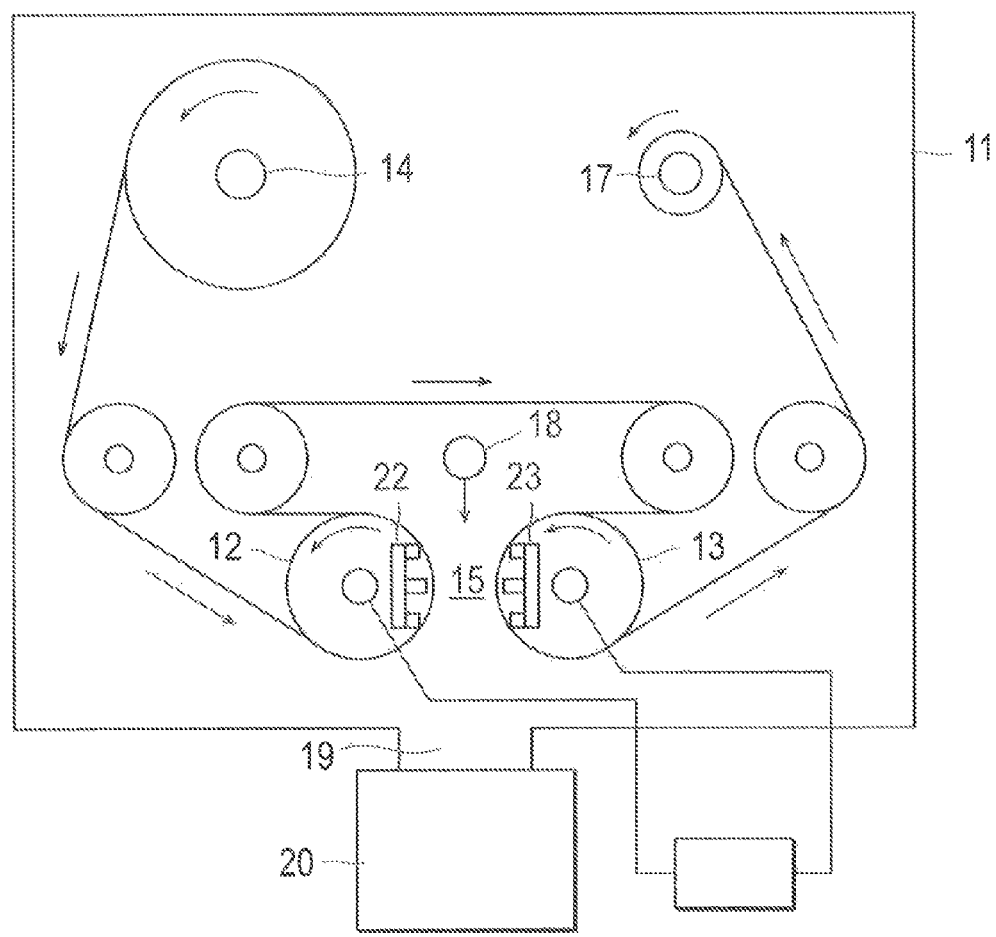
FIG. 17 is a schematic cross-sectional view illustrating an example of an apparatus used for forming a first gas barrier layer.

FIG. 17 is an example of a plasma CVD apparatus which is capable of producing a film in a roll-to-roll manner while continuously transporting a film roll base in a vacuum chamber and can also be preferably used in the present invention. In the figure, reference numeral 11 denotes a vacuum chamber, reference numerals 12 and 13 denote film formation rolls, reference numeral 14 denotes an unwind roll, reference numeral 15 denotes a facing space, reference numeral 17 denotes a wind-up roll, reference numeral 18 denotes a film formation gas supply pipe, reference numeral 19 denotes a vacuum exhaust port, and reference numeral 20 denotes a vacuum pump.

As described above, mention was made of an example of the method for forming a first barrier layer by a vacuum plasma CVD method, and, as the method for forming a first barrier layer, a plasma CVD method without the need for a vacuum is preferred, and an atmospheric pressure plasma CVD method is further preferred.

The atmospheric pressure plasma CVD method by which plasma CVD treatment is carried out at near atmospheric pressure has high productivity without the need for reduction in pressure, as well as a high film formation rate due to high plasma density in comparison with a plasma CVD method under vacuum. It further provides an extremely homogeneous film since the mean free step of a gas is very short on a high pressure condition under atmospheric pressure in comparison with the conditions of an ordinary CVD method.

In the case of atmospheric pressure plasma treatment, nitrogen gas or an element from Group 18 of the periodic table, specifically, helium, neon, argon, krypton, xenon, radon, or the like is used as a discharge gas. Of these, nitrogen, helium, and argon are preferably used, and, particularly, nitrogen is preferred also in view of the low cost.

<Atmospheric Pressure Plasma Treatment in Which Two or More Electric Fields with Different Frequencies are Formed>

Preferred embodiments of atmospheric pressure plasma treatment will be described below. The atmospheric pressure plasma treatment preferably employs a manner in which two or more electric fields having different frequencies are formed in the discharge space by forming an electric field obtained by superposing a first high frequency electric field and a second high frequency electric field as described in International Publication No. WO 2007/026545.

Specifically, it is preferable that the frequency of the second high frequency electric field $\omega_2$ be higher than the frequency of the first high frequency electric field $\omega_1$, the relationship among the strength of the first high frequency electric field V1, the strength of the second nigh frequency electric field V2, and the strength of the discharge starting electric field IV meet $$V1 \geq IV > V2 \text{ or } V1 > IV \geq V2$$

and the power density of the second high frequency electric field be 1 W/cm$^2$ or more.

By adopting such electric discharge conditions, for example, even a discharge gas having a high discharge starting electric field, such as nitrogen gas, can start discharge, a nigh density and stable plasma state can be maintained, and thin film formation with high performance can be carried out.

When nitrogen is used as a discharge gas in the above-described measurement, the strength of a discharge starting electric field IV ($\frac{1}{2}$Vp–p) is around 3.7 kV/mm; and, therefore, nitrogen gas can be excited to cause a plasma state by applying an electric field of which the strength of the first high frequency electric field meets V1≥3.7 kV/mm in the above-described relationship.

As the frequency of the first power source, 200 kHz or less can be preferably used. Further, the waveform of the electric field may be a continuous wave or a pulse wave. The lower limit is desirably around 1 kHz.

On the other hand, as the frequency of the second power source, 800 kHz or more is preferably used. The higher the frequency of the second power source is, the higher the density of the plasma is, whereby a dense and nigh quality thin film can be obtained. The upper limit is desirably around 200 MHz.

The first high frequency electric field is necessary for starting the electric discharge of a discharge gas having a high strength of a discharge starting electric field, and a higher plasma density can be caused by the high frequency and the nigh power density of the second high frequency electric field. A dense and nigh quality thin film can be formed by forming high frequency electric fields from such two electric sources.

An atmospheric pressure or a near pressure thereof as used herein is around 20 kPa to 110 kPa and is preferably 93 kPa to 104 kPa for obtaining good effects described herein.

Further, the excited gas as used herein refers to a gas in which at least some of the molecules of the gas shift from a current energy state to a higher energy state by obtaining energy and corresponds to the gas containing excited gas molecules, radicalized gas molecules, or ionized gas molecules.

As a method for forming the first barrier layer according to the present invention, there can be preferably applied a method of mixing a gas containing a source gas containing silicon with an excited discharge gas to form a secondary excited gas in discharge space in which a high frequency electric field is generated under atmospheric pressure or near pressure thereof and exposing a base to the secondary excited gas to form an inorganic film.

More specifically, space between counter electrodes (discharge space) is made to be at atmospheric pressure or near pressure thereof as a first step, the discharge gas is introduced between the counter electrodes, a high-frequency voltage is applied between the counter electrodes to make the discharge gas in a plasma state, the discharge gas in the plasma state is subsequently mixed with the source gas outside the discharge space, and the base is exposed to this mixed gas (secondary excited gas) to form the first barrier layer on the base.

The material of the first barrier layer formed by the chemical vapor deposition method in accordance with the present invention can be selected from metal oxides, metal nitrides, metal carbides, or composite compounds thereof from the viewpoint of transparency. Further. It is desirable to substantially or completely form the first barrier layer as an inorganic layer. Especially, the first barrier layer preferably includes silicon oxide or silicon oxynitride or silicon nitride.

[Second Barrier Layer]

The second barrier layer according to the present invention is formed by coating a coating liquid containing a polysilazane compound on the first barrier layer formed by the chemical vapor deposition method and by being irradiated with vacuum ultraviolet rays.

As a coating method, any suitable methods may be adopted. Specific examples include spin coating methods, roll coating methods, flow coating methods, inkjet methods, spray coating methods, printing methods, dip coating methods, flow casting film formation methods, bar coating methods, gravure printing methods, and the like.

A coating thickness may be suitably set depending on the purpose. For example, the coating thickness may be set so that the thickness after drying is preferably around 1 nm to 100 µm, further preferably around 10 nm to 10 µm, most preferably around 10 nm to 1 µm.

(Coating Liquid Containing Polysilazane Compound)

The coating film according to the present invention is formed by coating a coating liquid containing a polysilazane compound on the first gas barrier layer formed on the belt-shaped base.

As a coating method, any suitable methods may be adopted.

Specific examples include roll coating methods, flow coating methods, inkjet methods, spray coating methods, printing methods, dip coating methods, flow casting film formation methods, bar coating methods, gravure printing methods, and the like.

The thickness of a coating film is not particularly limited since it is suitably set depending on the purpose of use of a gas barrier film, but, for example, the thickness of the coating film may be set so that the thickness after drying is preferably around 1 nm to 10 µm, further preferably around 10 nm to 10 µm, most preferably around 30 nm to 1 µm.

As used herein, "polysilazane compound", which is a polymer having a silicon-nitrogen bond, is a ceramic precursor inorganic polymer comprising Si—N, Si—H, N—H, or the like, such as $SiO_2$, $Si_3N_4$, or an intermediate solid solution $SiO_xN_y$ therebetween.

For coating to prevent a film base from being damaged, a polysilazane compound that ceramizes to be modified into silica at comparatively low temperature is preferred, as described in Japanese Patent Laid-Open No. 8-112879.

There is preferably used such a polysilazane compound having the following structures:

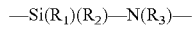

In the formula, $R_1$, $R_2$ and $R_3$ each represent a hydrogen atom, an alkyl group, an alkenyl group, a cycloalkyl group, an aryl group, an alkylsilyl group, an alkylamino group, or an alkoxy group.

In accordance with the present invention, the perhydropolysilazane in which all of $R_1$, $R_2$, and $R_3$ are hydrogen atoms is particularly preferred from the viewpoint of the denseness of an obtained gas barrier layer as a film.

On the other hand, organopolysilazane in which a part of a hydrogen moiety bound to Si thereof is substituted by an alkyl group has an advantage that adhesion with the undercoat base is improved and a hard and fragile ceramic film with polysilazane can be provided with toughness due to an alkyl group such as a methyl group to inhibit a crack from, being generated even in the case of a larger film thickness.

These perhydropolysilazane and organopolysilazane may be appropriately selected or mixed and used, depending on the application.

Perhydropolysilazanes are estimated to have a structure in which a straight-chain structure and a ring structure including six- and/or eight-membered rings coexist.

As for the molecular weight of polysilazanes, they have a number average molecular weight (Mn) of around 600 to 2000 (in terms of polystyrene), and there are a liquid or solid substance, depending on the molecular weight.

These polysilazanes are marketed in the state of solutions in which they are dissolved in organic solvents and the commercially available products can be used as polysilazane-containing coating liquids without being processed.

Other examples of polysilazane compounds ceramized at low temperature include a silicon alkoxide-added polysilazane obtained by reacting the above-described polysilazane with silicon alkoxide (Japanese Patent Laid-Open No. 5-238827), a glycidol-added polysilazane obtained by reaction with glycidol (Japanese Patent Laid-open No. 6-122852), an alcohol-added polysilazane obtained by reaction with alcohol (Japanese Patent Laid-open No. 6-240208), a metal carboxylate-added polysilazane obtained by reaction with a metal carboxylate (Japanese Patent Laid-Open No. 6-299118), an acetylacetonato complex-added polysilazane obtained by reaction with an acetylacetonato complex containing a metal (Japanese Patent Laid-Open No. 6-306329), a metallic fine particles-added polysilazane obtained by adding metallic fine particles (Japanese Patent Laid-Open No. 7-196986), and the like.

It is unfavorable to use such an alcohol-based organic solvent or an organic solvent containing water, as easily reacted with polysilazane, as an organic solvent for preparing a coating liquid containing a polysilazane compound.

As organic solvents, for example, hydrocarbon solvents such as aliphatic hydrocarbons, alicyclic hydrocarbons, and aromatic hydrocarbons; halogenated hydrocarbon solvents; and ethers such as aliphatic ethers and alicyclic ethers can be used.

Specific examples include hydrocarbons such as pentane, hexane, cyclohexane, toluene, xylene, solvesso, and turpentine; halogen hydrocarbons such as methylene chloride and trichloroethane; ethers such as dibutyl ether, dioxane, and tetrahydrofuran; and the like.

These solvents may be selected depending on purposes such as solubility of polysilazane and rates of evaporation of solvents and a plurality of solvents may also be mixed.

The concentration of a polysilazane compound in the coating liquid, which depends on the film thickness of the gas barrier layer of interest and the pot life of the coating liquid, is around 0.2 to 35 mass %.

Amine or a metal catalyst may also be added into the coating liquid in order to promote modification into a silicon oxide compound. Specifically, mention is made of AQUAMICA NAX120-20, NN110, NN310, NN320, NL110A, NL120A, NL150A, NP110, NP140, SP140, and the like, manufactured by AZ Electronic Materials.

The amount of these added catalysts is preferably adjusted to 2 mass % or less based on the polysilazane compound in order to avoid excessive silanol formation due to the catalysts, reduction in film density, increase in the number of film defects, and the like.

The coating liquid containing the polysilazane compound may contain an inorganic precursor compound other than the polysilazane compound. The inorganic precursor compound other than the polysilazane compound is not particularly limited as long as the coating liquid can be prepared.

Specific examples of compounds comprising silicon may include polysiloxane, polysilsesquioxane, tetramethylsilane, trimethylmethoxysilane, dimethyldimethoxysilane, methyltrimethoxysilane, trimethylethoxysilane, dimethyldiethoxysilane, methyltriethoxysilane, tetramethoxysilane, tetramethoxysilane, hexamethyldisiloxane, hexamethyldisilazane, 1,1-dimethyl-1-silacyclobutane, trimethylvinylsilane, methoxydimethylvinylsilane, trimethoxyvinylsilane, ethyltrimethoxysilane, dimethyldivinylsilane, dimethylethoxyethynylsilane, diacetoxydimethylsilane, dimethoxymethyl-3,3,3-trifluoropropylsilane, 3,3,3-trifluoropropyltrimethoxysilane, aryltrimethoxysilane, ethoxydimethylvinylsilane, arylaminotrimethoxysilane, N-methyl-N-trimethylsilylacetamide, 3-aminopropyltrimethoxysilane, methyltrivinylsilane, diacetoxymethylvinylsilane, methyltriacetoxysilane, aryloxydimethylvinylsilane, diethylvinylsilane, butyltrimethoxysilane, 3-aminopropyldimethylethoxysilane, tetravinylsilane, triacetoxyvinylsilane, tetraacetoxysilane, 3-trifluoroacetoxypropyltrimethoxysilane, diaryldimethoxysilane, butyldimethoxyvinylsilane, trimethyl-3-vinylthiopropylsilane, phenyltrimethylsilane, dimethoxymethylphenylsilane, phenyltrimethoxysilane, 3-acryloxypropyldimethoxymethylsilane, 3-acryloxypropyltrimethoxysilane, dimethylisopentyloxyvinylsilane, 2-aryloxyethylthiomethoxytrimethylsilane, 3-glycidoxypropyltrimethoxysilane, 3-arylaminopropyltrimethoxysilane, hexyltrimethoxysilane, heptadecafluorodecyltrimethoxysilane, dimethylethoxyphenylsilane, benzoyloxytrimethylsilane, 3-methacryloxypropyldimethoxymethylsilane, 3-methacryloxypropyltrimethoxysilane, 3-isocyanatepropyltriethoxysilane, dimethylethoxy-3-glycidoxypropylsilane, dibutoxydimethylsilane, 3-butylaminopropyltrimethylsilane, 3-dimethylaminopropyldiethoxymethylsilane, 2-(2-aminoethylthioethyl)triethoxysilane, bis(butylamino)dimethylsilane, divinylmethylphenylsilane, diacetoxymethylphenylsilane, dimethyl-p-tolylvinylsilane, p-styryltrimethoxysilane, diethylmethylphenylsilane, benzyldimethylethoxysilane, diethoxylmethylphenylsilane, decylmethyldimethoxysilane, diethoxy-3-glycidoxypropyplmethylsilane, oxtyloxytrimethylsilane, phenyltrivinylsilane, tetraaryloxysilane, dodecyltrimethylsilane, diarylmethylphenylsilane, diphenylmethylvinylsilane, diphenylethoxymethylsilane, diacetoxydiphenylsilane, dibenzyldimethylsilane, diaryldiphenylsilane, octadecyltrimethylsilane, methyloctadecyldimethylsilane, docosylmethyldimethylsilane, 1,3-divinyl-1,1,3,3-tetramethyldisiloxane, 1,3-divinyl-1,1,3,3-tetramethyldisilazane, 1,4-bis(dimethylvinylsilyl)benzene, 1,3-bis(3-acetoxypropyl)tetramethyldisiloxane, 1,3,5-trimethyl-1,3,5-trivinylcyclotrisiloxane, 1,3,5-tris(3,3,3-trifluoropropyl)-1,3,5-trimethylcyclotrisiloxane, octamethylcyclotetrasiloxane, 1,3,5,7-tetraethoxy-1,3,5,7-tetramethylcyclotetrasiloxane, decamethylcyclopentasiloxane, and the like.

As the polysiloxane, which preferably has highly reactive Si—H, a methyl hydrogen polysiloxane is preferred. Examples of the methyl hydrogen polysiloxane may include TSF484 manufactured by Momentive Performance Materials Inc.

Polysilsesquioxanes having any cage-shaped, ladder-shaped, and random-shaped structures may be preferably used. Examples of polysilsesquioxanes with cage shapes may include Q8 series manufactured by Mayaterials, Inc.: Octakis(tetramethylammonium)pentacyclo-octasiloxane-octakis(yloxide)hydrate; Octa(tetramethylammonium)silsesquioxane, Octakis(dimethylsiloxy)octasilsesquioxane, Octa[[3-[(3-ethyl-3-oxetanyl)methoxy]propyl]dimethylsiloxy]octasilsesquioxane; Octaallyloxetane silsesquioxane, Octa[(3-Propylglycidylether)dimethylsiloxy]silsesquioxane; Octakis[[3-(2,3-epoxypropoxy)propyl]dimethylsiloxy]octasilsesquioxane, Octakis[[2-(3,4-epoxycyclohexyl)ethyl]dimethylsiloxy]octasilsesquioxane, Octakis[2-(vinyl)dimethylsiloxy]silsesquioxane; Octakis(dimethylvinylsiloxy)octasilsesquioxane, Octakis[(3-hydroxypropyl)dimethylsiloxy]octasilsesquioxane, Octa[(methacryloylpropyl)dimethylsilyloxy]silsesquioxane, Octakis[(3-methacryloxypropyl)dimethylsiloxy]octasilsesquioxane; hydrogenated silsesquioxane containing no organic group; and the like. Examples of polysilsesquioxanes in which cage-shaped, ladder-shaped, and random-shaped structures are considered to be mixed and exist may include SR-20, SR-21 and SR-23 which are polyphenylsilsesquioxanes manufactured by Konishi Chemical Ind. Co., Ltd.; SP-13 which is a polymethylsilsesquioxane; and SR-33 which is a polymethylphenylsilsesquioxane. Also, Fox Series, manufactured by Dow Corning Toray Co., Ltd., which are polyhydrogensilsesquioxane solutions commercially available as spin-on glass materials, may be preferably used.

Particularly, among them, inorganic silicon compounds which are solid at ordinary temperature are preferred, and hydrogenated silsesquioxane is more preferably used.

(Ultraviolet Ray Irradiation Step)

As for the second barrier layer according to the present invention, at least one part of polysilazane is converted into silicon oxide to form a gas barrier layer having a Si—O bond in an ultraviolet ray irradiation step for irradiating a coating film containing polysilazane with vacuum ultraviolet rays.

In the ultraviolet ray irradiation step, using a plurality of light sources of a vacuum ultraviolet ray (VUV) which face the base and have a uniform illuminance in the widthwise direction of the base, the coating film is irradiated with a vacuum ultraviolet ray while moving the base, on which the coating film is formed, in the longitudinal direction relatively with respect to the light sources, to form the gas barrier layer.

In the ultraviolet ray irradiation step, an illuminance of the vacuum ultraviolet ray received on a coating film surface by the coating film, which moves relatively with respect to the light sources from start to end of the irradiation with the vacuum ultraviolet ray, is 160 mW/cm$^2$ or less, there is a period T during which an illuminance of the vacuum ultraviolet ray on the coating film surface is 50 mW/cm$^2$ or more and 160 mW/cm$^2$ or less, and an amount of energy (E1) of a vacuum ultraviolet ray received on the coating film surface within the period T is 180 mJ/cm$^2$ or more and 1800 mJ/cm$^2$ or less.

In accordance with the present invention, there are the plurality of ultraviolet light sources facing the base and each of the plurality of light sources has the uniform illuminance in the widthwise direction of the base.

Having the uniform illuminance in the widthwise direction of the base means having the uniform illuminance on a straight line along the direction from one point of one side to one point of the other side along the longitudinal direction of belt shape.

An angle between the straight line and a longitudinally parallel straight, line is preferably 80° C. to 90° particularly preferably 90°.

The uniform illuminance means that the distribution of the illuminance from one side to the other side is within ±10%.

An illuminance on a coating film surface can be measured by previously measuring a distance from a light source to a surface coated with a coating liquid and by measuring the illuminance of vacuum ultraviolet rays from the light source at the distance under the environment of the ultraviolet ray irradiation step.

The distribution of an illuminance being within ±10% means that the illuminances of ten points to equally divide a part from one side to the other side into 9 parts are measured and a difference between an average value at the ten points and a value at each point is not more than 10% of the average value.

An illuminance is measured using a UV integral actinometer: C8026/H 8025 UV POWER METER, manufactured by Hamamatsu Photonics K.K., using a sensor head of 172 nm. The measurement can be set so that a distance between a light source lamp tube surface and the measuring surface of the sensor head has a predetermined value, an exclusive jig capable of filling nitrogen so that an atmosphere between the lamp tube surface and the measuring surface of the sensor head has an oxygen concentration equal to that in the ultraviolet ray irradiation step is produced, and the measurement is carried out using the jig.

For the vacuum ultraviolet rays according to the present invention, specifically, vacuum ultraviolet rays of 100 to 200 nm are preferably used. It is effective to carry out the irradiation with the vacuum ultraviolet rays at any time point as long as it is carried out after forming the coating film.

The base on which the coating film is formed is moved relatively in the longitudinal direction with respect to the light sources in the ultraviolet ray irradiation step, and a method of moving (transporting) the belt-shaped base in the longitudinal direction with respect to the fixed light sources is preferably used.

A moving rate (transportation rate) is generally preferably in a range of 0.2 m/min to 100 m/min, particularly preferably in a range of 0.5 m/min to 50 m/min, depending on a light source.

In the ultraviolet ray irradiation step, an illuminance of the vacuum ultraviolet ray received on a coating film surface by the coating film which moves relatively with respect to the light sources from start to end of the irradiation with the vacuum ultraviolet ray, is 160 mW/cm$^2$ or less, there is a period T during which an illuminance of the vacuum ultraviolet ray on the coating film surface is 50 mW/cm$^2$ or more and 160 mW/cm$^2$ or less, and an amount of energy (E1) of a vacuum ultraviolet ray received on the coating film, surface within the period T is 180 mJ/cm$^2$ or more and 1800 mJ/cm$^2$ or less.

In accordance with the present invention, a gas barrier layer excellent in gas barrier property is obtained by applying energy of 180 mJ/cm² or more and 1800 mJ/cm² or less to the coating film at an illuminance of 50 mW/cm² or more and 160 mW/cm² or less, as described above.

Although this is because, in the case of an illuminance of more than 160 mJ/cm² or an energy amount (E1) of more than 1800 mJ/cm², the degree of the contribution to a reaction for forming silicon oxide by the irradiation with ultraviolet rays is relatively decreased to increase the degree of ultraviolet rays that breaks a film, the function of the gas barrier property is deteriorated.

The reason why the gas barrier property is extremely greatly improved by the irradiation at the illuminance according to the present invention is not clear but is supposed as described below.

It is supposed that a reaction where a bond in which silicon in a silazane compound is involved is cut and oxidized is further uniformly carried out in the coating film in the illuminance range of the present invention, and, since heat generated by the reaction is appropriate, the volume of the coating film is extremely uniformly changed by the reaction and the heat, deformation due to by the heat of the base is prevented, and occurrence of cracking is therefore prevented.

It is also supposed as described above since a gas barrier layer having a very excellent gas barrier property is not obtained even by irradiation at the same energy in a lower range than the illuminance according to the present invention.

That is, the contribution of irradiation energy received during a period other than the period T to formation of a good gas barrier layer is very low.

A ratio (E2/E1) of an amount of energy (E2) of a vacuum ultraviolet ray received on the coating film surface during a period other than the period T to the E1 is preferably 0 or more and 0.25 or less in view of a gas barrier property and productivity.

The period T is a period during which irradiation is carried out at 50 mW/cm² or more and a rate of time of the period T to time of a total period Z in the ultraviolet ray irradiation step is preferably 30% or more, particularly preferably 70% or more in view of a gas barrier property and productivity.

As used herein, the time of the total period Z in the ultraviolet ray irradiation step refers to time in measurement from the start of the time when the illuminance of the vacuum ultraviolet ray received by the coating film on the coating film surface at the start of the ultraviolet ray irradiation step is 0.1 mW/cm² or more to the end of the time when the illuminance of the vacuum ultraviolet ray received by the coating film on the coating film surface at the end of the ultraviolet ray irradiation step is less than 0.1 mW/cm².

An aspect of increasing the rate of the period T to the total period of the ultraviolet ray irradiation step as described above is obtained by shortening a distance between the plurality of line light sources over the line in the widthwise direction.

As the vacuum ultraviolet ray irradiation apparatus used in irradiation with vacuum ultraviolet rays, a commercially available lamp (e.g., produced by M.D. Excimer Inc. or Ushio Inc.) can be used.

FIG. 1 is a schematic cross-sectional view of an example of the vacuum ultraviolet ray irradiation apparatus used in the production method of the present invention.

A base 1 having a coating film is guided by a back roll 5 of which the temperature can be regulated, is transported in an arrow direction, and is irradiated with vacuum ultraviolet rays from excimer lamps 2 which face the transported base 1.

The excimer lamps 2 are held by excimer lamp holding members 3 which serve as external electrodes in an irradiation chamber 4.

The irradiation conditions of the present invention can be achieved by appropriately adjusting a lamp type, the number of lamps, an installation spacing between lamps, a distance between each lamp and a surface to be irradiated, oxygen concentration in an irradiation atmosphere, and the like.

Since the vacuum-ultraviolet light is higher than the interatomic bonding forces of most substances, an atomic bond can be directly cut by the action only of a photon, called a light quantum process, and, therefore, it can be preferably used.

A gas barrier layer having a Si—O bond can be efficiently formed at low temperature without the need for hydrolysis by using this action.

As a vacuum ultraviolet light source, a noble gas excimer lamp is preferably used.

A noble gas atom such as Xe, Kr, Ar, or Ne is not chemically bound to make a molecule and is therefore referred to as an inert gas.

However, a noble gas atom (excited atom) gaining energy by discharge and/or the like can be bound to another atom to make a molecule. When the noble gas is xenon,

$e + Xe \rightarrow Xe^*$

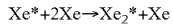

$Xe^* + 2Xe \rightarrow Xe_2^* + Xe$

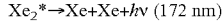

$Xe_2^* \rightarrow Xe + Xe + h\nu$ (172 nm)

are established, excimer light of 172 nm is emitted when transition of $Xe_2^*$, which is an excited excimer molecule, to a ground state occurs.

Features of the excimer lamp include high efficiency due to concentration of emission on one wavelength to cause almost no emission of light other than necessary light. Further, the temperature of an object can be kept low since surplus light is not emitted. Furthermore, instant lighting and flashing are possible since time is not needed for starting/restarting.

A method of using dielectric barrier discharge is known to provide excimer light emission. The dielectric barrier discharge is very thin discharge called micro discharge, like lightning, generated in the gas space, which is disposed between both electrodes via a dielectric (transparent quarts in the case of the excimer lamp), by applying a high frequency and a high voltage of several tens of kHz to the electrodes, and, when a streamer of the micro discharge reaches a tube wall (dielectric), a dielectric surface is charged and the micro discharge therefore becomes extinct.

Excimer light emission is caused by spreading the micro discharge over the whole tube wall and repeating generation and extinction thereof. Therefore, light flicker which can be recognized even by the naked eye occurs. Since a streamer at very high temperature locally directly reaches the tube wall, deterioration in the tube wall may also be accelerated.

As the method of efficiently obtaining excimer light emission, a method in which electrodeless electric field discharge, other than the dielectric barrier discharge, is used also known. It is electrodeless electric field discharge by capacitive coupling and is also sometimes called RF discharge. Although a lamp, electrodes and arrangement thereof may be basically the same as those in the dielectric barrier discharge, a high frequency applied between both electrodes illuminates at several of MHz. In the electrodeless electric field discharge, discharge uniform in terms of space and time is obtained as described above and a long-lasting lamp without flicker is therefore obtained.

In the case of the dielectric barrier discharge, since micro discharge occurs only between the electrodes, the outside electrode must cover the whole external surface and have a material, through which light passes, for taking out light to the outside, in order to effect discharge in the whole discharge space.

Therefore, the electrode in which thin metal wires are reticulated is used. This electrode easily damaged by ozone and/or the like generated by vacuum-ultraviolet light in oxygen atmosphere since wires which are as thin as possible are used so as not to block light.

For preventing this, it is necessary to make the periphery of the lamp, that is, the inside of an irradiation apparatus have inert gas atmosphere such as nitrogen and to dispose a window with synthetic quarts to take out irradiated light. The window with synthetic quartz is not only an expensive expendable product but also causes the loss of light.

Since a double cylinder type lamp has an outer diameter of around 25 mm, a difference between the distances to an irradiated surface just under a lamp axis and on the side surface of the lamp is unneglectable to cause a difference in illuminance. Accordingly, even if such lamps are closely arranged, no uniform illumination distribution is obtained. The irradiation apparatus provided with the window with synthetic quartz enables equal distances in oxygen atmosphere and provides a uniform illumination distribution.

It is not necessary to reticulate an external electrode when electrodeless electric field discharge is used. Only by disposing the external electrode on a part of the external surface of the lamp, glow discharge spreads over the whole discharge space. For the external electrode, an electrode which serves as a light reflecting plate typically made of an aluminum block is used on the back surface of the lamp. However, since the outer diameter of the lamp is large as in the case of the dielectric barrier discharge, synthetic quartz is required for making a uniform illumination distribution.

The maximum feature of a narrow tube excimer lamp is a simple structure. Both ends of a quartz tube are only closed to seal a gas for excimer light emission therein.

The tube of the narrow tube lamp has an outer diameter of around 6 nm to 12 mm, and a high voltage is needed for starting when it is too thick.

As discharge form, any of dielectric barrier discharge and electrodeless electric field discharge can be used. As for the shape of the electrode, a surface contacting with the lamp may be planar; however, the lamp can be well fixed and the electrode closely contacts with the lamp to more stabilize discharge by the shape fitting with the curved surface of the lamp. Further, a light reflecting plate is also made when the curved surface is made to be a specular surface with aluminum.

A Xe excimer lamp is excellent in luminous efficiency since an ultraviolet ray with a short wavelength of 172 nm is radiated at a single wavelength. This light enables a high concentration of a radical oxygen atomic species or ozone to be generated with a very small amount of oxygen because of having a high oxygen absorption coefficient.

Further, the energy of light with a short wavelength of 172 nm which dissociates the bond of organic matter is known to have a high capacity.

Modification of a polysilazane film can be realized in a short time by the high energy of this active oxygen or ozone and ultraviolet radiation.

Accordingly, shortening of process time and reduction in the area of a facility, caused by a high throughput, and irradiation of an organic material, a plastic substrate, or the like, which is easily damaged by heat, are enabled in comparison with the low-pressure mercury vapor lamp and plasma cleaning which emit wavelengths of 185 nm and 254 nm.

The excimer lamp can be made to illuminate by input of a low power because of having high light generation efficiency. Further, it does not emit light with a long wavelength which becomes a factor for increasing temperature due to light but irradiates energy with a single wavelength in an ultraviolet range, and therefore has the feature of capable of suppressing increase in the surface temperature of an article to be irradiated. Therefore, it is suitable for a flexible film material such as PET which is considered to be subject to heat.

(Oxygen Concentration During Irradiation with Vacuum Ultraviolet Rays (VUV))

A reaction during irradiation with ultraviolet rays requires oxygen; however, since vacuum ultraviolet rays are prone to deteriorate efficiency in an ultraviolet ray irradiation step due to absorption by oxygen, it is preferable to perform the irradiation with vacuum ultraviolet rays in the state in which oxygen concentration is minimum.

The oxygen concentration during the irradiation with vacuum ultraviolet rays (VUV) is preferably 10 to 10000 ppm (1%), further preferably 50 to 5000 ppm.

As a gas filled in an irradiation atmosphere used during the irradiation with vacuum ultraviolet rays, a dry inert gas is preferred, and a dry nitrogen gas is particularly preferred from the viewpoint of a cost. The adjustment of the oxygen concentration can be performed by measuring the flow rates of an oxygen gas and an inert gas introduced into an irradiation house and changing a flow ratio.

(Overcoat Layer)

An overcoat layer may be disposed on the second barrier layer according to the present invention or, when a gas barrier layer is further disposed on the second barrier layer, on this gas barrier layer.

(Material Used in Overcoat Layer)

As organic substances used in an overcoat layer, organic resins such as organic monomers, oligomers, and polymers can be preferably used. These organic resins preferably have a polymerizable group or a crosslinking group, and a layer formed by coating with an organic resin composition coating liquid that contains these organic resins and optionally a polymerization initiator, a crosslinking agent, or the like is preferably subjected to light irradiation treatment or heat treatment to be cared. As used herein, "crosslinking group" refers to a group capable of crosslinking a binding polymer by chemical reaction occurring in light irradiation treatment or heat treatment. The chemical structure thereof is not particularly limited as long as it is a group having such a function but examples of functional groups which can be subjected to addition polymerization include ethylenically unsaturated groups and cyclic ether groups such as epoxy groups/oxetanyl groups. They may also be functional groups which can become radicals by light irradiation, and examples of such crosslinkable groups include a thiol group, a halogen atom, an onium salt structure, and the like. Especially, the ethylenically unsaturated groups are preferred, and examples thereof include functional groups described in Paragraphs 0130-0139 in Japanese Patent Laid-Open No. 2007-17948.

The elasticity modulus of an overcoat layer can be adjusted to a desired value by appropriately adjusting the structure of an organic resin, the density of a polymerizable group, the density of a crosslinking group, the ratio of a crosslinking agent, curing conditions, and the like.

Specific examples of organic resin compositions include a resin composition comprising an acrylate compound having a radical reactive unsaturated compound; a resin composition comprising an acrylate compound and a mercapto compound having a thiol group; a resin composition in which a polyfunctional acrylate monomer such as epoxy acrylate, urethane acrylate, polyester acrylate, polyether acrylate, polyethylene glycol acrylate, or glycerol methacrylate is dissolved; and the like. Such resin compositions as described above may also be optionally mixed and used and are not particularly limited as long as the mixture is a photosensitive resin containing a reactive monomer having one or more photopolymerizable unsaturated bonds in a molecule.

Examples of the reactive monomer having one or more of the photopolymerizable unsaturated bonds in the molecule include methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethyl hexyl acrylate, n-ootyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentanyl acrylate, 2-ethyl hexyl acrylate, glycerol acrylate, glycidyl acrylate, 2-hydroxyethyl acrylate, 2-hydroxypropyl acrylate, isobornyl acrylate, isodecyl acrylate, isooctyl acrylate, lauryl acrylate, 2-methoxyethyl acrylate, methoxy ethylene glycol acrylate, phenoxy ethyl, aerylate, stearyl acrylate, ethylene glycol diacrylate, diethylene glycol diacrylate, 1,4-butanediol diacrylate, 1,5-pentanediol diacrylate, 1,6-hexadiol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyl trimethylolpropane triacrylate, pentaerythritol triacrylate, pentaerythritol tetraacrylate, ethylene oxide modified pentaerythritol triacrylate, ethylene oxide modified pentaerythritol tetraacrylate, propione oxide modified pentaerythritol triacrylate, propione oxide modified pentaerythritol tetraacrylate, triethylene glycol diacrylate, polyoxypropyl trimethylolpropane triacrylate, butylene glycol diacrylate, 1,2,4-butanediol triacrylate, 2,2,4-trimethyl-1,3-pentadiol diacrylate, diallyl fumarate, 1,10-decanediol dimethylacrylate, pentaerythritol hexaacrylate, and monomers obtained by substituting the above-described acrylates by methacrylates, γ-methacryloxypropyltrimethoxysilane, 1-vinyl-2-pyrrolidone, and the like. The above-described reactive monomers may be used singly or as mixtures of two or more kinds thereof or as mixtures with other compounds.

A composition of the photosensitive resin contains a photopolymerization initiator. Examples of the photopolymerization initiator include benzophenone, methyl o-bensoylbenzoate, 4,4-bis(dimethylamine)benzophenone, 4,4-bis(diethylamine)benzophenone, α-aminoacetophenone, 4,4-dichlorobenzophenone, 4-benxoyl-4-methyldiphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyldimethyl ketal, benzylmethoxyethyl acetal, benzoin methyl ether, benzoin butyl ether, anthraquinone, 2-tert-butylanthraquinone, 2-amylanthraquinone, β-chloroanthraquinone, anthrone, benzanthrone, dibenzosuberone, methyleneanthrone, 4-azidobenzylacetophenone, 2,6-bis(p-azidebenzylidene)cyclohexane, 2,6-bis(p-azidebenzylidene)-4-methylcyclohexanone, 2-phenyl-1,2-butadione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl[4-(methylthio)phenyl]-2-morpholino-1-propane, 2-benzyl-2-dimethylamino-1-(4-morpholinophenyl)-butanone-1, naphthalenesulfonyl chloride, quinolinesulfonyl chloride, n-phenylthioacridone, 4,4-azobisisobutyronitrile, diphenyl disulfide, benxthiazole disulfide, triphenylphosphine, caimphorquinone, carbon tetrabromide, tribromophenylsulfone, benzoin peroxide, and Eosine, as well as combinations of a photoreductive pigment such as Methylene Blue and a reducing agent such as ascorbic acid or triethanolamine, and the like. These photopolymerization initiators may be used singly or in combination of two or more kinds thereof.

An inorganic material may be incorporated into the overcoat layer. The incorporation of the inorganic material generally leads to the increased elasticity modulus of the overcoat layer. The elasticity modulus of the overcoat layer can also be adjusted to a desired value by appropriately adjusting the content ratio of the inorganic material.

As the inorganic material, inorganic fine particles with a number average particle diameter of 1 to 200 nm are preferred and inorganic fine particles with a number average particle diameter of 3 to 100 nm are more preferred. As the inorganic fine particles, metal oxides are preferred from the viewpoint of transparency.

Examples of the metal oxides include, but are not particularly limited to, $SiO_2$, $Al_2O_3$, $TiO_2$, $ZrO_2$, ZnO, $SnO_2$, $In_2O_3$, BaO, SrO, CaO, MgO, $VO_2$, $V_2O_5$, $CrO_2$, $MoO_2$, $MoO_3$, $MnO_2$, $Mn_2O_3$, $WO_3$, $LiMn_2O_4$, $Cd_2SnO_4$, $CdIn_2O_4$, $Zn_2SnO_4$, $ZnSnO_3$, $Zn_2In_2O_5$, $Cd_2SnO_4$, $CdIn_2O_4$, $Zn_2SnO_4$, $ZnSnO_3$, $Zn_2In_2O_5$, and the like. These may be used alone or in combination of two or more kinds.

In order to obtain the dispersion of inorganic fine particles, adjustment according to recent papers may be carried out while commercially available inorganic fine particle dispersions may also be preferably used.

Specific examples may include various metal oxide dispersions such as Snowtech series manufactured by Nissan Chemical Industries, Ltd., organosilica sol, NANOBYK series manufactured by BYK Japan KK, and NanoDur manufactured by Nanophase Technologies Corporation.

These inorganic fine particles, which are subjected to surface treatment, may also be used.

As inorganic materials, there can also be used tabular fine particles such as mica groups such as natural mica, and synthetic mica, talc represented by $MgO.4SiO.H_2O$, teniolite, montmorillonite, saponite, hectorite, and zirconium phosphate.

Specific examples of the above-described natural mica include muscovite, paragonite, phlogopite, biotite, and lepidolite. Further, examples of the synthetic mica include non-swellable micas such as fluorine phlogopite $KMg_3(AlSi_3O_{10})F_2$ and potassium tetrasilic mica $KMg_{2.5}(Si_4O_{10})F_2$; swellable micas such as Na tetrasililic mica $NaMg_{2.5}(Si_4O_{10})F_2$, Na or Li teniolite (Na, Li) $Mg_2Li(Si_4O_{10})F_2$, and montmorillonite-based Ma or Li hectorite (Na, Li)$_{1/8}Mg_{2/5}Li_{1/8}(Si_4O_{10})F_2$; and the like. Synthetic smectite is also useful.

The ratio of the inorganic material in the overcoat layer is preferably in a range of 10 to 95 mass %, more preferably in a range of 20 to 90 mass %, based on the total of the overcoat layer.

In the overcoat layer, a so-called coupling agent may be used alone or in admixture with another material. Although such a coupling agent is a silane coupling agent, a titanate-based coupling agent, an aluminate-based coupling agent, or the like without particular limitation, silane coupling agents are preferred from the viewpoint of the stability of a coating liquid.

Specific examples of the silane coupling agents include halogen-containing silane coupling agents (such as 2-chloroethyltrimethoxysilane, 2-chloroethyltriethoxysilane, 3-chloropropyltrimethoxysilane, and 3-chloropropyltriethoxysilane); epoxy group-containing silane coupling agents [such as 2-(3,4-epoxycyclohexyl)ethyltrimethoxysilane, 2-(3,4-epoxycyclohexyl)ethyltriethoxysilane, 3-(3,4-epoxycyclohexyl)propyltrimethoxysilane, 2-glycidyloxyethyltrimethoxysilane, 2-glycidyloxyethyltriethoxysilane, 3-glycidyloxypropyltrimethoxysilane, and 3-glycidyloxypropyltriethoxysilane]; amino group-containing silane coupling agents (such as 2-aminoethyltrimethoxysilane, 3-aminopropyltrimethoxysilane, 3-aminopropyltriethoxysilane, 2-[N-(2-aminoethyl)amino]ethyltrimethoxysilane, 3-[N-(2-aminoethyl)amino]propyltrimethoxysilane, 3-(2-aminoethyl)amino]propyltriethoxysilane, and 3-[N-(2-aminoethyl)amino]propyl methyl dimethoxysilane); mercapto group-containing silane coupling agents (such as 2-mercaptoethyltrimethoxysilane, 3-mercaptopropyltrimethoxysilane, and 3-mercaptopropyltriethoxysilane); vinyl group-containing silane coupling agents (such as vinyl trimethoxysilane and vinyltriethoxysilane); (meth)acryloyl group-containing silane coupling agents (such as 2-methacryloyloxyethyltrimethoxysilane, 2-methacryloyloxyethyltriethoxysilane, 2-acryloyloxyethyltrimethoxysilane, 3-methacryloyloxypropyltrimethoxysilane, 3-methacryloyloxypropyltriethoxysilane, and 3-acrylcyloxypropyltrimethoxysilane); and the like. These silane coupling agents may be used alone or in combination of two or more kinds.

The overcoat layer is preferably formed by preparing a coating liquid by blending an organic resin, an inorganic material, and optionally another component with an appropriately optionally used diluting solvent, coating the coating liquid on the surface of a gas barrier layer by a coating method known in the art, and thereafter irradiating the liquid with ionizing radiation to cure the liquid. A method for irradiation with ionizing radiation can be per formed by irradiation with ultraviolet rays in a wavelength region of 100 to 400 nm, preferably 200 to 400 nm, emitted from an ultra-high-pressure mercury lamp, a high-pressure mercury lamp, a low-pressure mercury lamp, a carbon arc, a metal halide lamp, or the like. Alternatively, it can be performed by irradiation with electron beams in a wavelength region of 100 nm or less, emitted from, a scanning- or curtain-type electron beam accelerator.

(Applications of Gas Barrier Film)

The gas barrier film according to the present invention can be applied generally to packages for electronic devices and the like or display materials such as plastic substrates for organic EL elements, solar cells, liquid crystals, and the like, resin bases for various devices, and various device elements.

The gas barrier film of the present invention can also be preferably applied as various materials for sealing and films.

An element for an electronic device including the gas barrier film of the present invention will be described by taking an organic photoelectric conversion element as an example.

(Organic Photoelectric Conversion Element)

A gas barrier film is preferably transparent when used in an organic photoelectric conversion element, and such a constitution that the gas barrier film is used as a base (also referred to as a support) to receive sunlight from the side thereof is enabled.

That is, for example, a transparent conductive thin film such as ITO can be disposed as a transparent electrode on this gas barrier film to constitute a resin support for an organic photoelectric conversion element.

In addition, the ITO transparent, conductive film disposed on the support is used as an anode, a porous semiconductor layer is disposed thereon, a cathode including a metal film is further formed to form an organic photoelectric conversion element, another sealing material (which may also be the same gas barrier film as that used in the support) is overlapped thereon, the gas barrier film support is adhered to the periphery thereof, thereby enabling the organic photoelectric conversion element to be sealed, and, as a result, the influence of a gas such as moisture or oxygen in outside air on the organic photoelectric conversion element can be blocked.

The resin support for an organic photoelectric conversion element is obtained by forming a transparent conductive film on the gas barrier layer or overcoat layer of the gas barrier film formed in such a manner.

Formation of a transparent conductive film can be conducted by using a vacuum deposition method, a sputtering method, or the like and it can also be produced by a coating method such as a sol-gel method using, e.g., a metal alkoxide of indium, tin, or the like.

Further, as for the film thickness of the transparent conductive film, the transparent conductive film in the range of 0.1 to 1000 nm is preferred.

Subsequently, each layer of an organic photoelectric conversion element material (constitution layer) constituting an organic photoelectric conversion element will be described.

(Constitution of Organic Photoelectric Conversion Element and Solar Cell)

Preferred aspects of an organic photoelectric conversion element and a solar cell will be explained. In addition, preferred aspects of the organic photoelectric conversion element according to the present invention will be described in detail below, but the solar cell includes the organic photoelectric conversion element as the constitution thereof, and the preferred constitution of the solar cell can also be described as in the case of the organic photoelectric conversion element.

The organic photoelectric conversion element is not particularly limited, and it is preferably an element which has an anode, a cathode and at least one electric power generation Layer (a mixed layer of a p-type semiconductor and an n-type semiconductor, also referred to as a bulk heterojunction layer or an i layer) sandwiched between both, and generates electric current when irradiated with light.

Preferred specific examples of the layer constitution of the organic photoelectric conversion element (similar to the preferred layer constitution of the solar cell) will be described below.

(i) Anode/electric power generation layer/cathode
(ii) Anode/hole transport layer/electric power generation layer/cathode
(iii) Anode/hole transport layer/electric power generation layer/electron transport layer/cathode
(iv) Anode/hole transport layer/p-type semiconductor layer/electric power generation layer/n-type semiconductor layer/electron transport layer/cathode
(v) Anode/hole transport layer/first electric power generation layer/electron transport layer/intermediate electrode/hole transport layer/second electric power generation layer/electron transport layer/cathode.

The electric power generation layer needs to contain a p-type semiconductor material which can convey a hole, and an n-type semiconductor material which can convey an electron, and these materials may produce a heterojunction with substantially two layers or may produce a bulk heterojunction with one layer inside of which is of a mixed state, while the bulk heterojunction is preferred because of high photoelectric conversion efficiency. The p-type semiconductor material and the n-type semiconductor material used in the electric power generation layer will be described later.

As the same as the case of an organic EL element, the efficiency of taking out holes and electrons from the anode/cathode, respectively, can be improved by sandwiching the electric power generation layer with a hole transport layer and an electron transport layer and, therefore, the constitutions having those ((ii) and (iii)) are more preferred. The electric power generation layer itself may also be of a constitution in which the electric power generation layer is sandwiched between a layer containing a p-type semiconductor material alone and a layer containing an n-type semiconductor material alone as in (iv) (also referred to as p-i-n constitution) in order to improve the rectification property of holes and electrons (selectivity of carriers taken out). In order to raise the utilization efficiency of sunlight, it may also be of a tandem constitution (constitution in (v)) in which sunlight with different wavelengths is absorbed by respective electric power generation layers.

Materials constituting these layers will be explained below.
(Organic Photoelectric Conversion Element Material)
There will be described materials used for forming an electric power generation layer (also referred to as "photoelectric conversion layer") of an organic photoelectric conversion element.
(P-Type Semiconductor Material)
Examples of p-type semiconductor materials preferably used for an electric power generation layer (bulk heterojunction layer) in an organic photoelectric conversion element include various condensed polycyclic aromatic low molecular weight compounds and conjugated polymers and oligomers.

Examples of the condensed polycyclic aromatic low molecular weight compounds include compounds such as anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyanthrene, violanthene, isoviolanthene, circobiphenyl, and anthradithiophene; porphyrin, copper phthalocyanine; tetrathiafulvalene (TTF)-tetracyanoguinodimethane (TCNQ) complex, bisethylene-tetrathiafulvalene (BEDTTTF)-perchloric acid complex; and derivatives and precursors thereof.

Examples of the derivatives containing the condensed polycyclic compounds described above include pentacene derivatives having a substituent described in International Publication No. WO 03/16599, International Publication No. WO 03/28125, U.S. Pat. No. 6,690,029, Japanese Patent Laid-Open No. 2004-107216, and the like; pentacene precursors described in US 2003/136964; acene-based compounds substituted by a trialkylsilylethynyl group described in J. Amer. Chem. Soc., vol, vol 127. No 14. 4986, J. Amer. Chem. Soc., vol. 123, p 9482, J. Amer. Chem. Soc., vol. 130 (2008), No. 9, 2706, and the like; and the like.

Examples of the conjugated polymers include polythiophenes such as poly-3-hexylthiohene (P3HT) and oligomers thereof, polythiophenes having a polymerizable group described in Technical Digest of the International PVSEC-17, Fukuoka, Japan, 2007, p. 1225, polythiophene-thienothiophene copolymers described in Nature Material, (2006) vol. 5, p 328, polythiophene-diketopyrrolopyrrole copolymers described in International Publication No. WO 2008/000664, polythiophene-thizolothiazole copolymers described in Adv Mater, 2007 p 4160, polythiophene copolymers such as PCPDTBT described in Nature Mat., vol. 6 (2007), p 497, polypyrroles and oligomers thereof, polyanilines, polyphenylenes and oligomers thereof, polyphenylenevinylenes and oligomers thereof, polythienylenevinylenes and oligomers thereof, polyacethylene, polydiacetylene, polymer materials such as σ-conjugated polymers such as polysilane and polygerman.

As oligomer materials rather than polymer materials, oligomers such as: α-sexithioneneα,ω-dihexyl-α-sexithionene, α,ω-dihexyl-α-quinquethionene, and α,ω-bis(3-butoxypropyl)-α-sexithionene, which are thiophene hexamers, can be preferably used.

Among these compounds, preferred are compounds which have such high solubility into an organic solvent that a solution process can be carried out and which produce a crystalline thin film and can realize a high mobility after drying.

When an electron transporting layer is formed on an electric power generation layer by a coating method, since there may occur the problem that the solution for the electron transporting layer may dissolve the electric power generation layer, there can also be used such a material as to be insoluble after forming a layer in a solution process.

Examples of such materials may include materials insoluble through cross-linked polymerization after being coated, such as polythiophenes having a polymerizable group as described in Technical Digest of the International PVSEC-17, Fukuoka, Japan, 2007, p 1225; materials insoluble (to be pigments) by reaction of a soluble substituent by applying energy such as heat as described in US 2003/136964, Japanese Patent Laid-Open No. 2008-16834, and the like; and the like.

(N-Type Semiconductor Material)
Examples of n-type semiconductor materials used in the bulk heterojunction layer may include, but are not particularly limited to, e.g., fullerene, octaazaporphyrin, etc., a perfluoro compound of a p-type semiconductor, of which hydrogen atoms are replaced with fluorine atoms (such as perfluoropentacene or perfluorophthalocyanine), and a polymer compound which contains an aromatic carboxylic acid anhydride and its imide as a skeleton, such as naphthalenetetracarboxylic anhydride, naphthalenetetracarboxylic diimide, perylenetetracarboxylic anhydride, or perylenetetracarboxylic diimide.

However, preferred is a fullerene derivative which enables high speed (~50 fs) and effective charge separation with varieties of p-type semiconductor materials. Examples of the fullerene derivative may include fullerene C60, fullerene C70, fullerene C76, fullerene C78, fullerene C84, fullerene C240, fullerene C540, mixed fullerene, fullerene nano-tube, multilayered nano-tube, single-layered nano-tube, nano-horn (cone type), and the like, and a fullerene derivative obtained by substituting a part thereof with a hydrogen atom, a halogen atom, a substituted or unsubstituted alkyl group, an alkenyl group, an alkynyl group, an aryl group, a heteroaryl group, a cyclcoalkyl group, a silyl group, an ether group, a thioether group, an amino group, a silyl group, or the like.

Among these, it is preferable to use a fullerene derivative which has an improved solubility by having a substituent, such as [6,6]-phenyl $C_{61}$-butyric acid methyl ester (abbreviated name: PCBM), [6,6]-phenyl $C_{61}$-butyric acid-n-butyl ester (PCBnB), [6,6]-phenyl $C_{61}$-butyric acid-isobutyl ester (PCBiB), [6,6]-phenyl $C_{61}$-butyric acid n-hexyl ester (PCBH), bis-PCBM described, in Adv. Mater., vol. 20 (2008), p 2116, amino fullerene described in Japanese Patent Laid-Open No. 2006-199674, metallocene fullerene described in Japanese Patent Laid-Open No. 2008-130889, and fullerene having a cyclic ether group described in U.S. Pat. No. 7,329, 709.

(Hole Transport Layer, Electron-Blocking Layer)
The organic photoelectric conversion element preferably has the hole transport layer between the bulk heterojunction layer and the anode. It becomes possible to more effectively take out charges generated in the bulk heterojunction layer since it has such a layer.

As materials constituting these layers, for example, for the hole transport layer, there can be used, for example: PEDOT, such as BaytronP (trade name) manufactured by Starck Vitec; polyaniline and its dope material; a cyan compound described in International Publication No. WO 06/19270; and the like.

In addition, the hole transport layer which has a LUMO level shallower than the LUMO level of the n-type semiconductor material used in a bulk heterojunction layer is imparted with an electron-blocking function having an rectifying effect by which the electron generated in the bulk heterojunction layer is not passed to the anode side.

Such a hole transport layer is also called an electron-blocking layer, and it is more preferable to use a hole transport layer having such a function. Examples of these materials include triaryl amine-based compounds as described in Japanese Patent Laid-Open No. 5-271166, metal oxides such as molybdenum oxide, nickel oxide and tungsten oxide, and the like.

Moreover, the layer which includes a p-type semiconductor material alone used in the bulk heterojunction layer can also be used. As means for forming these layers, although any one of a vacuum deposition method and a solution coating method can be used, preferably used is a solution coating method. When a coated film is formed in an under layer before forming the bulk heterojunction layer, it will have an effect of leveling the coating surface, an effect such as leaking is reduced, and it is therefore preferable.

(Electron Transport Layer/Hole-Blocking Layer)

The organic photoelectric conversion element preferably has the electron transport layer between the bulk heterojunction layer and the cathode. It becomes possible to more effectively take out charges generated in the bulk heterojunction layer since it has such a layer.

As the electron transport layer, there can be used: octaazaporphyrin and a perfluoro compound of a p-type semiconductor (such as perfluoro pentacene or perfluoro phthalocyanine), and, similarly, the electron transport layer which has a HOMO level deeper than the HOMO level of the p-type semiconductor material used for a bulk heterojunction layer is imparted with a hole blocking function having an rectifying effect by which the hole generated in the bulk heterojunction layer is not passed to the cathode side.

Such an electron transport layer is also called a hole-blocking layer, and it is more preferable to use the electron transport layer which have such a function.

As such materials, there can be used phenanthrene-based compounds such as bathocuproine; n-type semiconductor materials such as naphthalene tetracarboxylic acid anhydride, naphthalenetetracarboxylic acid diimide, perylenetetracarboxylic acid anhydride and perylenetetracarboxylic acid diimide; n-type inorganic oxides such as titanium oxide, zinc oxide and gallium oxide; alkali metal compounds such as lithium fluoride, sodium fluoride and cesium fluoride; and the like.

Moreover, the layer including an n-type semiconductor material alone used in the bulk heterojunction layer can also be used. As means for forming these layers, although any one of a vacuum deposition method and a solution coating method can be used, preferably used is the solution coating method.

(Other Layers)

It is also preferable to have a constitution containing various intermediate layers in an element for the purpose of improvement in energy conversion efficiency and improvement in lifetime of the element. Examples of the interlayer may include hole-blocking layers, electron-blocking layers, hole injection layers, electron injection layers, exciton blocking layers, UV absorption layers, light reflection layers, wavelength, conversion layers, and the like.

(Transparent Electrode (First Electrode))

The transparent electrode is not particularly limited to a cathode or an anode and can be selected according to an element constitution, but the transparent electrode is preferably used as an anode. For example, in the case of use as an anode, it is preferable to use an electrode which transects light of 380 to 800 nm.

As materials, there can be used, for example, transparent conductive metal oxides such as indium tin oxide (ITO), $SnO_2$, and ZnO; metal thin films such as gold, silver, and platinum; metal nanowires; and carbon nanotubes.

Also usable is a conductive polymer selected from the group consisting of derivatives of: polypyrrole, polyaniline, polythiophene, polythienylene vinylene, polyazulene, polylsothianaphthene, polycarbazole, polyacethylene, polyphenylene, polyphenylene vinylene, polyacene, polyphenyl acetylene, polydiacetylene, and polynaphthalene. A transparent electrode can also be constructed by combining a plurality of these conductive compounds.

(Counter Electrode (Second Electrode))

A counter electrode may also be a sole layer of a conductive material, however, in addition to materials with conductivity, a resin may also be used in combination to hold the materials. As a conductive material for the counter electrode, there is used a material in which a metal, an alloy, or an electric conductive compound, having a small work function (4 eV or less), or a mixture thereof is used as an electrode material.

Specific examples of such electrode materials include sodium, sodium-potassium alloy, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, rare earth metals, and the like.

Among these, from the viewpoints of a taking out property of an electron and the endurance to oxidation and/or the like, preferable is a mixture of these metals and the second metal which is a metal that has a larger work function and is more stable than these metals, for example, a magnesium/silver mixture, a magnesium/aluminum mixture, a magnesium/indium mixture, an aluminum/aluminum oxide ($Al_2O_3$) mixture, a lithium/aluminum mixture, aluminum, or the like.

The counter electrode can be produced by producing a thin film by using a method such as vapor deposition or sputtering of the electrode materials. Further, the film thickness is generally selected from 10 nm to 5 µm, and preferably from 50 to 200 nm.

When a metallic material is used as a conductive material for a counter electrode, light reaching the counter electrode side is reflected to the first electrode side, this light becomes possible to be reused, it is again absorbed by a photoelectric conversion layer, and this is preferable because this results in more improvement in its photoelectric conversion efficiency.

The counter electrode may also be made of: a metal (for example, gold, silver, copper, platinum, rhodium, ruthenium, aluminum, magnesium, indium, or the like), nanoparticles, nanowires, and a nano structure made of carbon; and a dispersion of nanowires is preferable, since it can produce a transparent counter electrode having high electrical conductivity by a coating method.

When the counter electrode side is made light transmissive, after thinly producing a film of a conductive material suitable for a counter electrode, for example, aluminum and aluminum alloy, silver, a silver compound, and the like, having a film thickness of around 1 to 20 nm, a light transmissive counter electrode can be produced by disposing a film of a conductive light transmissive material cited for the description or the above-described transparent electrode.

(Intermediate Electrode)

As a material for an intermediate electrode which is needed in a tandem constitution such as (v) of the layer constitutions of the organic photoelectric conversion element, preferable is a layer using the compound having both transparency and electrical conductivity, and materials used for the above-mentioned transparent electrode are usable (a transparent metal oxide such as ITO, AZO, FTO, or titanium oxide; a very thin metal layers made of such as Ag, Al, and Au; a layer containing nanoparticles and nanowires; a conductive polymer material such as PEDOT: PSS or polyaniline; and the like).

In addition, among the aforementioned hole transport layer and electron transport layer, there may be a combination used as an intermediate electrode (electric charge recombination layer) when they are suitably combined and laminated with each other, and, when such a constitution is employed, it is preferable since a step for forming one layer can be eliminated.

(Metal Nanowire)

An organic or inorganic fiber coated with a metal, a conductive metal oxide fiber, a metal nanowire, a carbon fiber, a carbon nanotube, or the like can be used as the conductive fiber, and a metal nanowire is preferred.

Generally a metal nanowire indicates a linear structure composed of a metallic element as a main component. In particular, the metal nanowire in accordance with the present invention means a linear structure having a diameter of a nanometer (nm) size.

In order to form a long conductive path by one metal nanowire and to express an appropriate light scattering property, a metal nanowire preferably has an average length of 3 μm or more, further preferably 3 μm to 500 μm, and particularly preferably 3 μm to 300 μm. In addition, the relative standard deviation of the length is preferably 40% or less.

Moreover, from the viewpoint of transparency, the average diameter is preferably smaller while the average diameter is preferably larger from the viewpoint of electrical conductivity. In accordance with the present invention, the average diameter of the metal nanowire is preferably from 10 nm to 300 nm, and more preferably from 30 nm to 200 nm. In addition, the relative standard deviation of the diameter is preferably 20% or less.

There is no limitations in particular to the metal composition of the metal nanowire, and it can be composed of one or a plurality of metals of noble metal elements or base metal elements (metal elements other than the noble metal elements); it preferably contains at least one metal belonging to the group consisting of noble metals (for example, gold, platinum, silver, palladium, rhodium, iridium, ruthenium, osmium, and the like), iron, cobalt, copper, and tin; and at least silver is preferably included in it from the viewpoint of electrical conductivity.

Moreover, for the purpose of achieving compatibility of conductivity and stability (sulfuration or oxidation resistance and migration resistance of metal nanowire), it also preferably contains silver and at least one metal belonging to the noble metals except silver. When, the metal nanowire according to the present invention contains two or more metallic elements, for example, metal composition may be different between the surface and the inside of the metal nanowire or the whole metal nanowire may nave the same metal composition.

There is no limitation in particular to means for producing a metal nanowire and, for example, a known method such as a liquid phase method or a gas phase method may be used. There is also no limitation in particular to a specific production method, a known production method may be used.

For example, a method for producing an Ag nanowire may be referred to Adv. Mater., 2002, 14, 833-837; Chem. Mater., 2002, 14, 4786-4745, and the like; a method for producing an Au nanowire may be referred to Japanese Patent Laid-Open No. 2006-233252 and the like; a method for producing a Cu nanowire may be referred to Japanese Patent Laid-Open No. 2002-266007 and the like; and a method for producing a Co nanowire may be referred to Japanese Patent Laid-Open No. 2004-149871 and the like. Particularly, the methods for producing Ag nanowires, reported in Adv. Mater. and Chem. Mater. as mentioned above, may be preferably applied as a method for producing a metal nanowire according to the present invention, since it is possible to easily produce an Ag nanowire in an aqueous system and the electrical conductivity of silver is maximum of all metals.

A three-dimensional conductive network is produced by mutual contact of nanowires and high conductivity is expressed; light can penetrate the window part of the conductive network where no metal nanowire is present, and further, it becomes possible to perform efficiently the generation of electricity from the organic photoelectric conversion layer portion by the scattering effect of the metal nanowires. It is a preferable embodiment to arrange a metal nanowire in a portion closer to the organic electric power generation layer portion in the first electrode because the scattering effect can be effectively utilized.

(Optical Function Layer)

The organic photoelectric conversion element may include various optical function layers for the purpose of efficiently receiving sunlight. As an optical function layer, there may be disposed, for example, an anti-reflection film; a light condensing layer such as a microlens array; a light diffusion layer which can scatter light reflected by the cathode and can make the light incident again on the electric power generation layer; and the like.

As anti-reflection layers, various known anti-reflection layers can be disposed; for example, when a transparent resin film is a biaxial stretching polyethylene terephthalate film, it is preferable to set the refractive index of the adhesion assisting layer, which is adjacent to the film, to be from 1.57 to 1.63 since this will improve transmittance by decreasing the interface reflection between the film substrate and the adhesion assisting layer. As a method of adjusting a refractive index, it can be carried out by appropriately adjusting the ratio of a binder resin to an oxide sol having a comparatively high refractive index such as a tin oxide sol or a cerium oxide sol and by coating it. Although the adhesion assisting layer may be a single layer, in order to improve an adhesion property, a constitution of two or more layers may also be used.

Regarding the light condensing layer, it is possible to increase an amount of the receiving light from a specific direction or, conversely, to reduce the incident angle dependency of sunlight by performing processing to dispose a structure on a microlens array on the sunlight receiving side of the supporting substrate or by using in combination with a so-called light condensing sheet.

As an example of a microlens array, there is made an arrangement in which the quadrangular pyramidal forms having a side of 30 μm and a vertex angle of 90 degrees are two-dimensionally arranged on the light taking out side of a substrate. The side is preferably in the range of 10 to 100 μm. When it is less than this range, the effect of diffraction will occur to result in coloring, while when it is more than this range, the thickness becomes large, whereby it is not preferable.

Further, examples of light scattering layers may include various anti-glare layers; layers in which nanoparticles, nanowires, and the like made of metals, various inorganic oxides, and the like are distributed in colorless transparent polymers; and the like.

(Film Formation Method and Surface Treatment Method)

Examples of methods for producing a bulk heterojunction layer in which an electron acceptor and an electron donor are mixed, a transport layer and an electrode may include vapor deposition methods, coating methods (including cast methods and spin coat methods), and the like. Of these, examples of methods for producing a bulk heterojunction layer may include vapor deposition methods, coating methods (including cast methods and spin coat methods), and the like.

Among these, a coating method fs preferred in order to increase the area of the interface which carries out charge separation of the above-mentioned hole and electron and to produce an element having high photoelectric conversion efficiency. Further, the coating method is also excellent in speed of production.

Although there is no limitation in the coating method to be used in this case, examples of the method include spin coating methods, cast methods from a solution, dip coating methods, blade coating methods, wire bar coating methods, gravure coating methods, spray coating methods, and the like. Furthermore, patterning can also be carried out by printing methods such as inkjet methods, screen printing methods, letterpress printing methods, intaglio printing methods, offset printing methods, flexographic printing methods, and the like.

After coating, it is preferable to heat the film in order to remove the residual solvent, water, and a gas, as well as to improve the mobility and to shift the absorption in the longer wavelength due to crystallization of a semiconductor material. When annealing treatment is carried out at a predetermined temperature during a production step, aggregation or crystallization is microscopically promoted and a suitable phase separation structure can be made in a bulk heterojunction layer. As a result, the carrier mobility of the bulk heterojunction layer can be improved and high efficiency can be obtained.

The electric power generation layer (bulk heterojunction layer) may be constituted by a single layer containing a uniform mixture of an electron acceptor and an electron donor or may be constituted by a plurality of layers each having a different mixing ratio of an electron acceptor and an electron donor. In this case, the production is enabled by using such a material which becomes insoluble after coating as mentioned above.

(Patterning)

There is no limitation in particular in the method and the process of patterning an electrode, an electric power generation layer, a hole transport layer, an electron transport layer, and the like, and a known procedure can be applied appropriately.

In the case of a soluble material for a bulk heterojunction layer, a transport layer, or the like, only a unnecessary part may be wiped off after complete coating such as die coating or dip coating or it may be directly patterned during coating by using a method such as an inkjet method or a screen printing method.

In the case of an insoluble material such as an electrode material, mask deposition of an electrode can be performed during vacuum deposition or it can be patterned by a known method such as etching or lift-off. Further, it may also be possible to produce a pattern by transferring the pattern formed on another substrate.

EXAMPLES

The present invention will be specifically explained with reference to examples below but the present invention is not limited thereto.

Example 1

<<Production of Gas Barrier Film>>

As described below, first, bases (a) to (c) were produced, and a gas barrier film was then produced on each produced base via a step for producing a first gas barrier layer and a step for producing a second gas barrier layer.

<<Production of Base (a)>>

A base (a) was prepared and used by using a polyester film having a thickness of 125 μm (Super low heat shrinkage PET Q83, manufactured by Teijin DuPont Films Japan Limited), which was a thermoplastic resin base (support) and both surfaces of which were subjected to adhesion-enhancing processing, and forming a bleedout preventing layer on one surface and a smooth layer on the other surface, as described below.

(Formation of Bleedout Preventing Layer)

On one surface of the above-described base, a UV curable organic/inorganic hybrid hard coat material OPSTAR Z7535 manufactured by JSR Corporation was coated so that the film thickness after dried was 4 μm, followed by conducting curing under a curing condition: 1.0 J/cm$^2$, under air atmosphere, using a high-pressure mercury lamp, and under a drying condition: 80° C. for 3 minutes to form a bleedout preventing layer.

(Formation of Smooth Layer)

Subsequently, on the opposite surface of the above-described base was formed, a UV curable organic/inorganic hybrid hard coat material OPSTAR Z7501 manufactured by JSR Corporation was coated so that the film thickness after dried was 4 μm, followed by drying under a drying condition: 80° C. for 3 minutes, and then conducting curing under air atmosphere using a high-pressure mercury lamp under a curing condition: 1.0 J/cm$^2$ to form a smooth layer.

The surface roughness Rz of she obtained smooth layer, specified in JIS B 0601, was about 25 nm.

The surface roughness was measured using AFM (atomic force microscope) SPI3800NDFM manufactured by SII. A measured range at one step was 80 μm×80 μm, three measurements were carried out on different measurement spots, and the average of Rz values obtained in the respective measurements was regarded as a measured value.

<<Production of Base (b)>>

A base (b) was prepared by using, as the heat-resistant base, a transparent polyimide-based film having a thickness of 200 μm (NEOPULIM L, manufactured by Mitsubishi Gas Chemical Company, Inc.) and its both surfaces of which were subjected to adhesion-enhancing processing, and forming a smooth layer on both, surfaces thereof, as described below.

(Formation of Smooth Layer)

Production of Smooth Layer Coating Liquid

There were mixed 8.0 g of trimethylolpropane triglycidyl ether (EPOLIGHT 100MF, manufactured by Kyoeisha Chemical Co., Ltd.), 5.0 g of ethylene glycol diglycidyl ether (EPOLIGHT 40E, manufactured by Kyoeisha Chemical Co., Ltd.), 12.0 g of silsesquioxane having an oxetanyl group; OX—SQ-H (manufactured by Toagosei Co., Ltd.), 32.5 g of 3-glycidoxypropyltrimethoxysilane, 2.2 g of Al(III)acetylacetonate, 134.0 g of methanol silica sol (manufactured by Nissan Chemical Industries, Ltd., solid content concentration of 30 mass %), 0.1 g of BYK333 (manufactured by BYK-Chemie GmbH) 125.0 g of butyl cellosolve, and 15.0 g of 0.1 N aqueous hydrochloric acid, and the mixture was stirred sufficiently. The resultant was further left at rest and degassed at room temperature to obtain a smooth layer coating liquid.

(Formation of Smooth Layer 1)

One surface of the above-described base was subjected to corona discharge treatment by a usual method, then coated with the produced, smooth layer coating liquid so that the film thickness after drying was 4 μm, and dried at 80° C. for 3 minutes. Heat treatment was further performed at 120° C. for 10 minutes to form a smooth layer 1.

(Formation of Smooth Layer 2)

A smooth layer 2 was formed on the surface opposite to the surface on which the smooth layer 1 of the above-described base was formed, in the same manner as the method for forming the smooth layer 1.

The surface roughnesses of the smooth layer 1 and the smooth layer 2 which were obtained were about 20 nm by Rz specified by JIS B 0601. The surface roughnesses were measured in the same manner as in the case of the base (a).

<<Production of Base (c)>>

A base (c) was obtained in the same manner as in the case of the base (b) except that SILPLUS H100 having a thickness of 100 μm, manufactured by Nippon Steel Chemical Co., Ltd., which was a film containing silsesquioxane having an organic-inorganic hybrid structure as a basic skeleton, was used as the heat-resistant base. Rz measured in the same manner as in the case of the case (a) was about 20 nm.

<<Production of First Gas Barrier Layers>>

Three kinds of first barrier layers a, b, and c were produced in combination of bases and coated surfaces as listed in Table 1.

(Production of First Gas Barrier Layer a)

Figure 3:
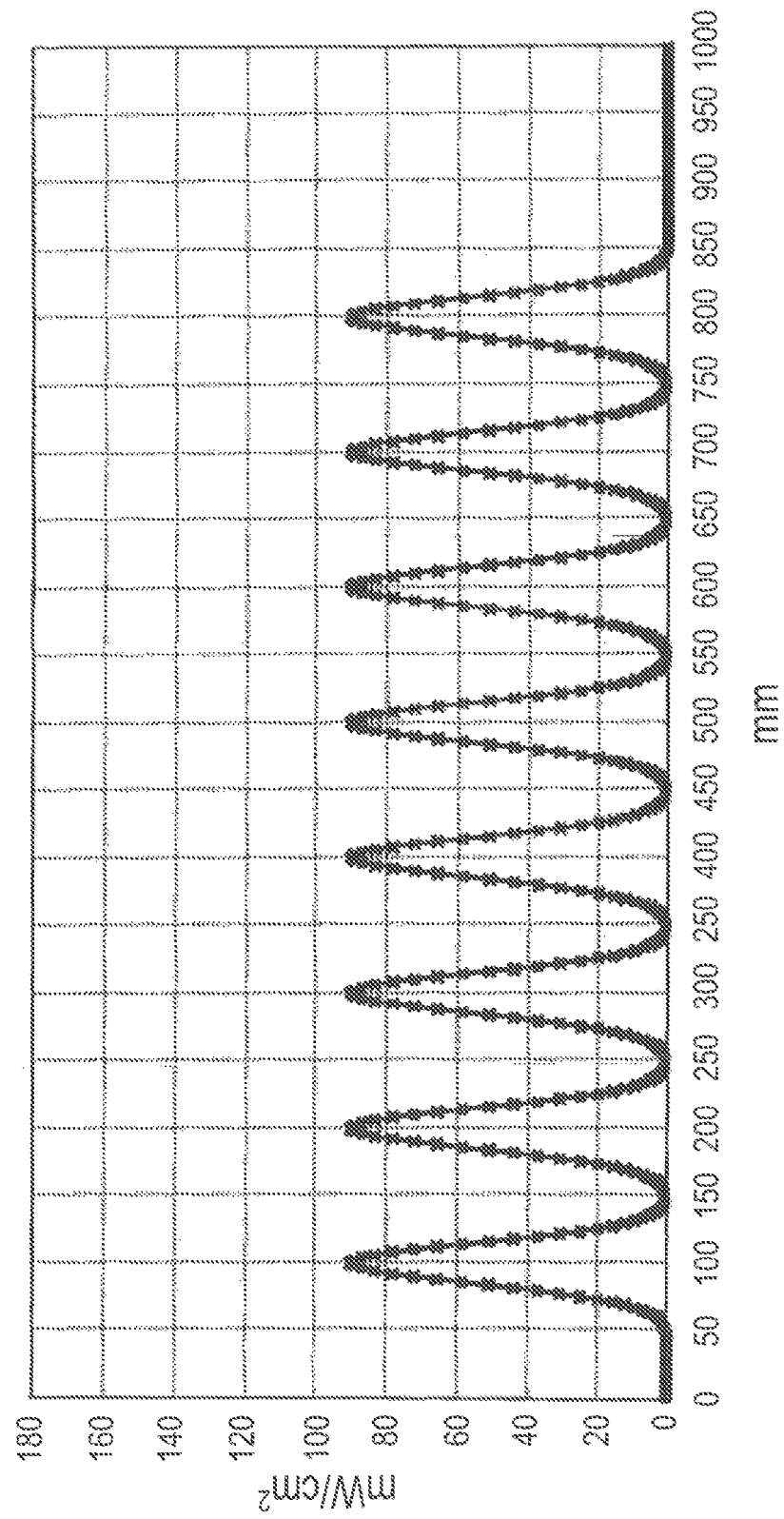
FIG. 3 is a view indicating an example (pattern B) of variation in illuminance received on a coating film surface in the ultraviolet ray irradiation step over time.
Figure 4:
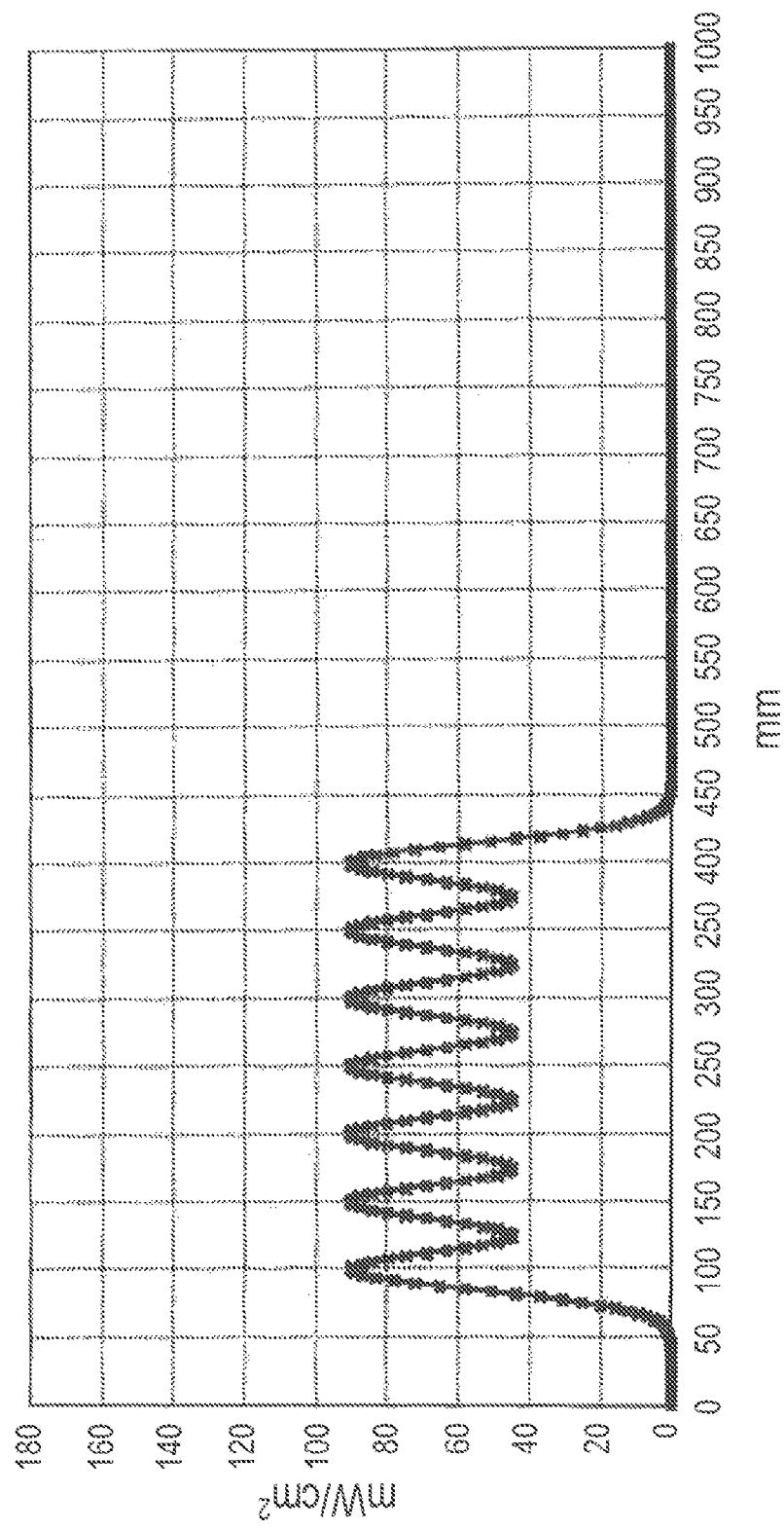
FIG. 4 is in view indicating an example (pattern C) of variation in illuminance received on a coating film surface in the ultraviolet ray irradiation step over time.
Figure 5:
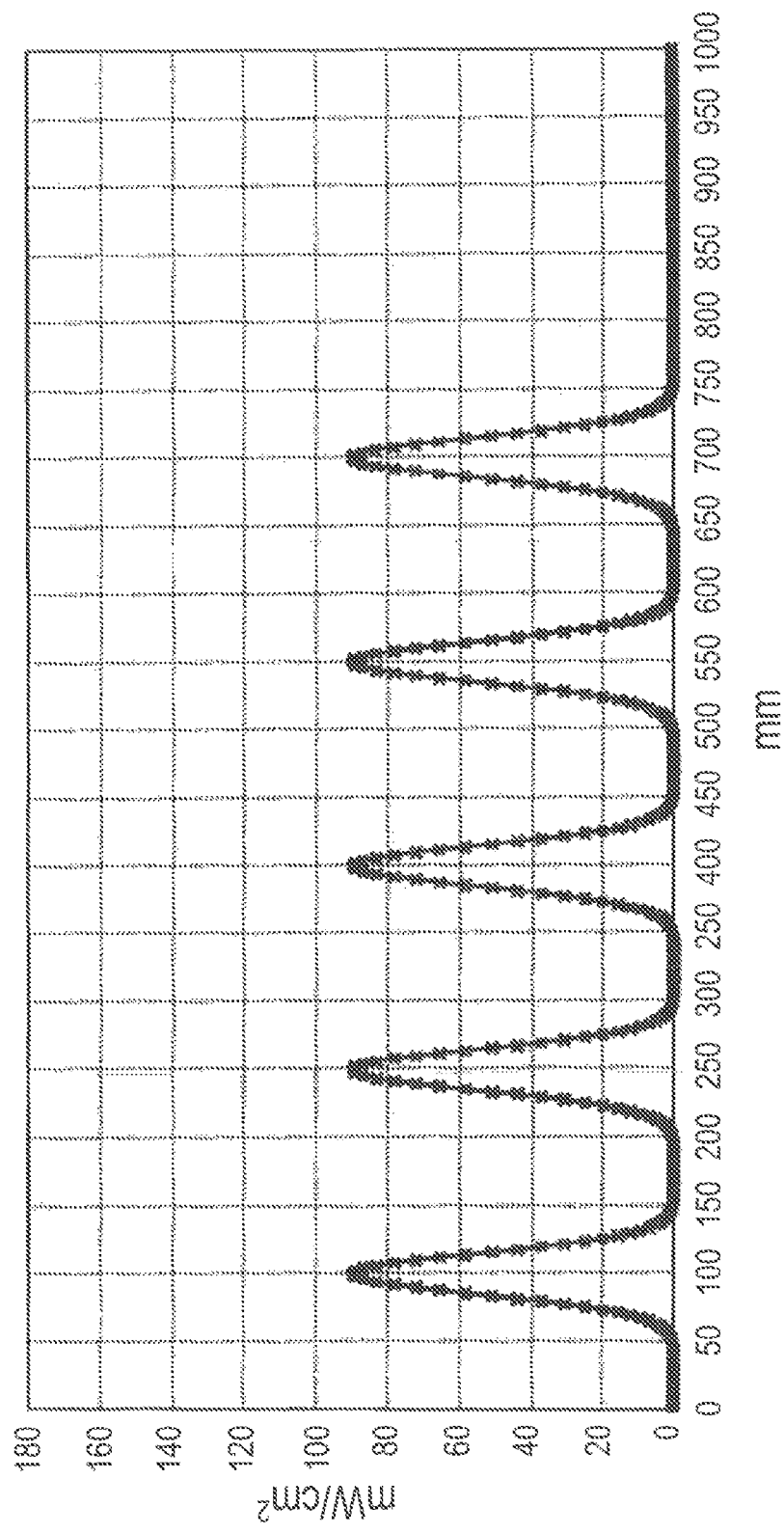
FIG. 5 is a view indicating an example (pattern D) of variation in illuminance received on a coating film surface in the ultraviolet ray irradiation step over time.
Figure 6:
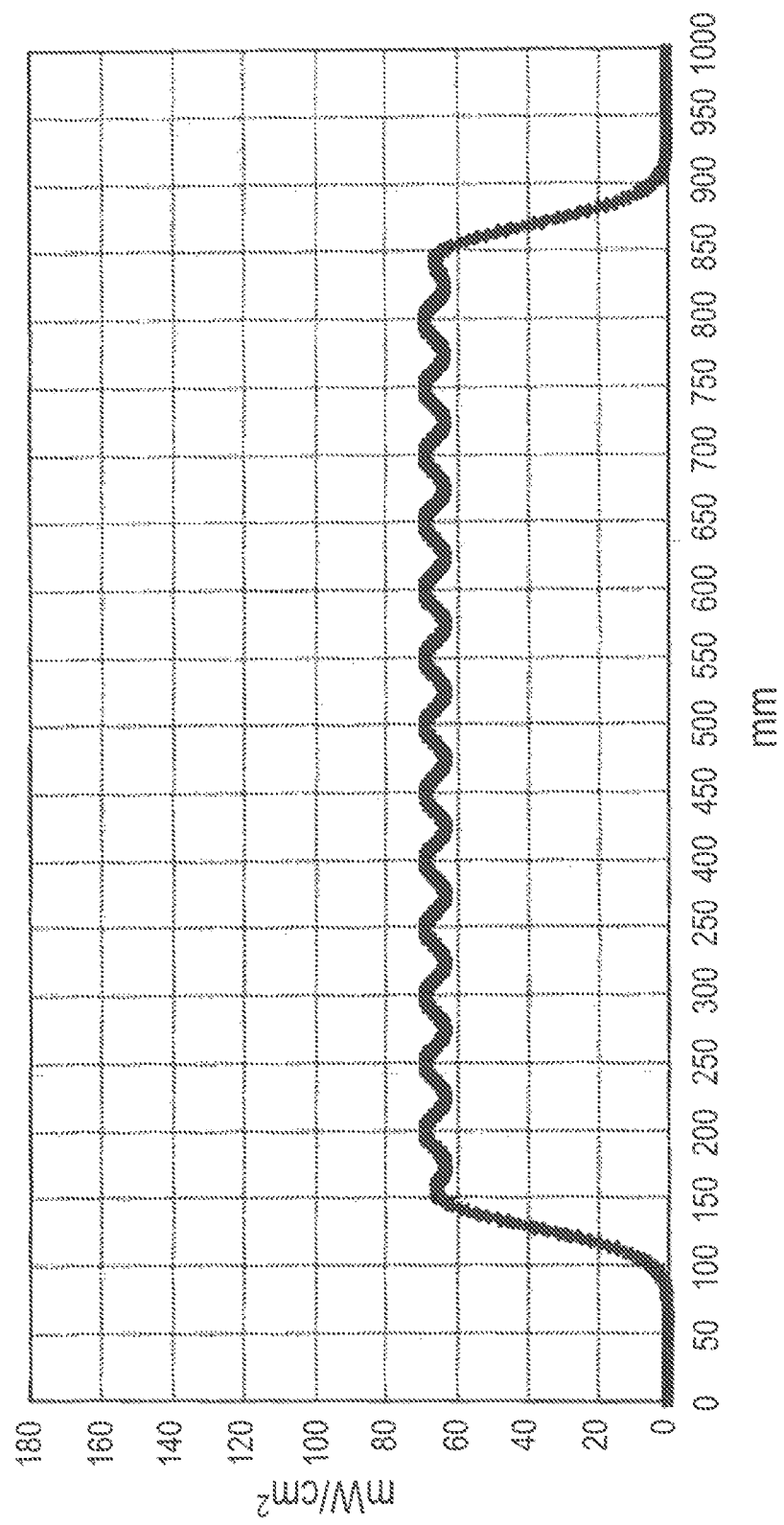
FIG. 6 is a view indicating an example (pattern E) of variation in illuminance received on a coating film surface in the ultraviolet ray irradiation step over time.
Figure 7:
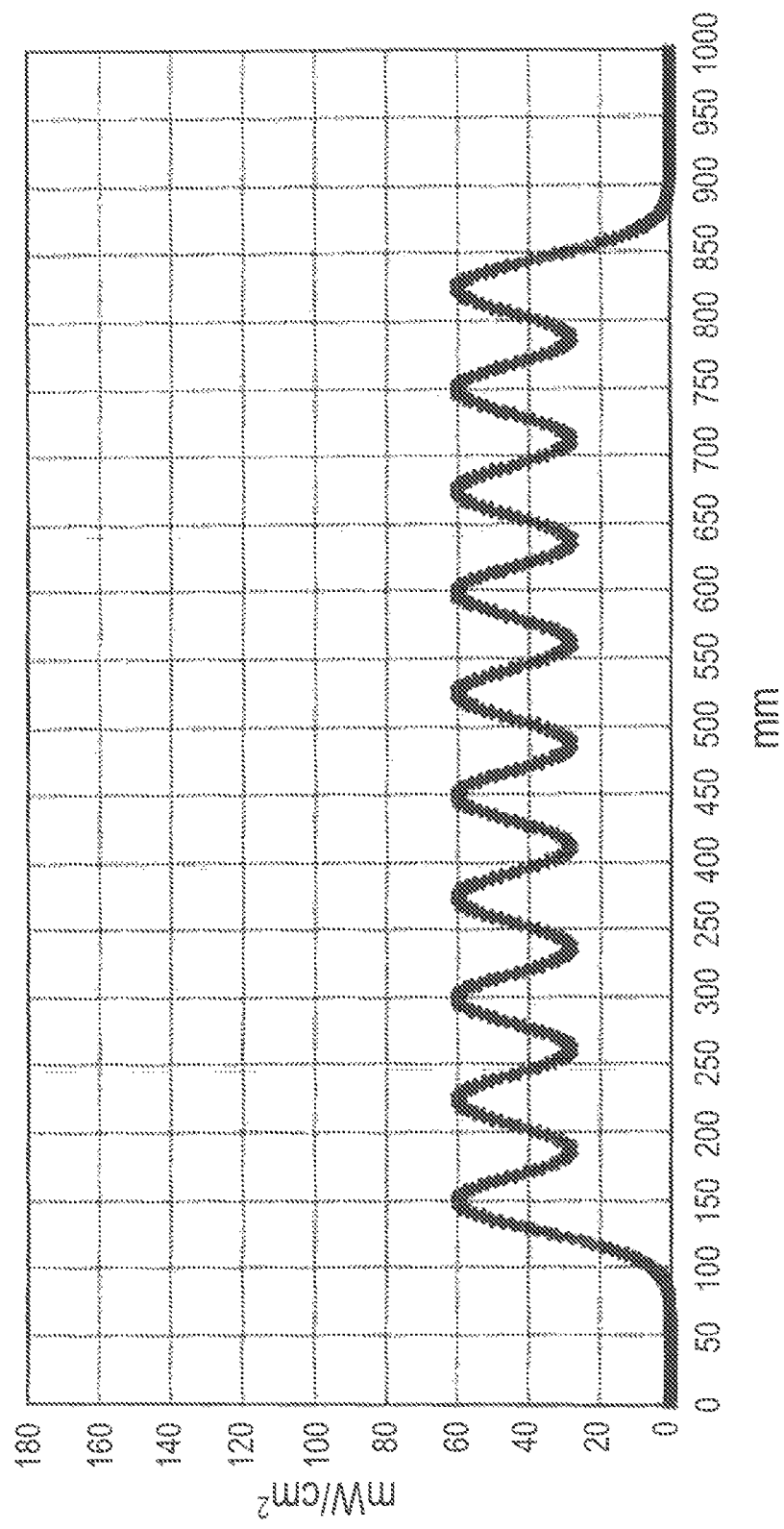
FIG. 7 is a view indicating an example (pattern F) of variation in illuminance received on a coating film surface in the ultraviolet ray irradiation step over time.
Figure 8:
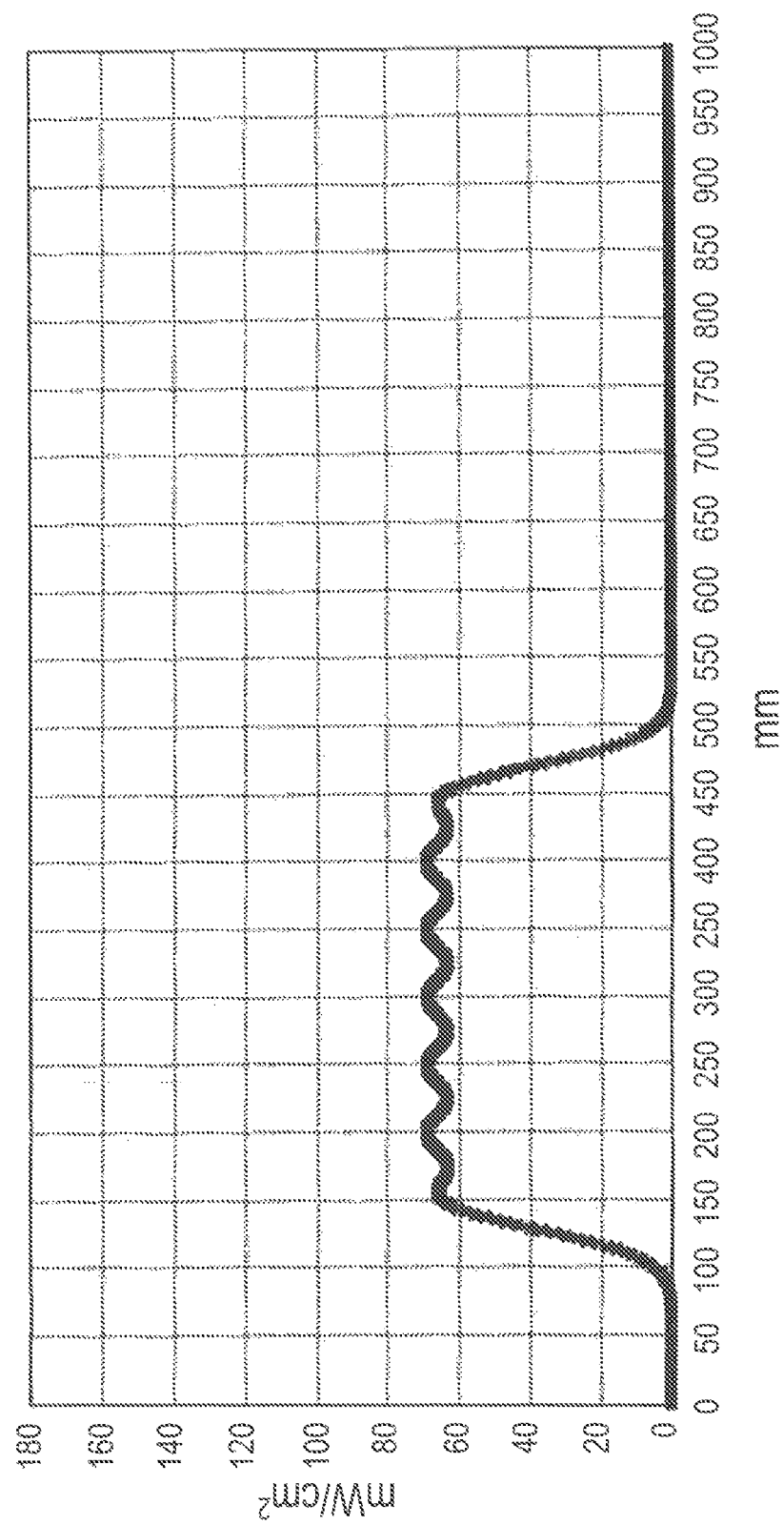
FIG. 8 is a view indicating an example (pattern G) of variation in illuminance received on a coating film surface in the ultraviolet ray irradiation step over time.
Figure 9:
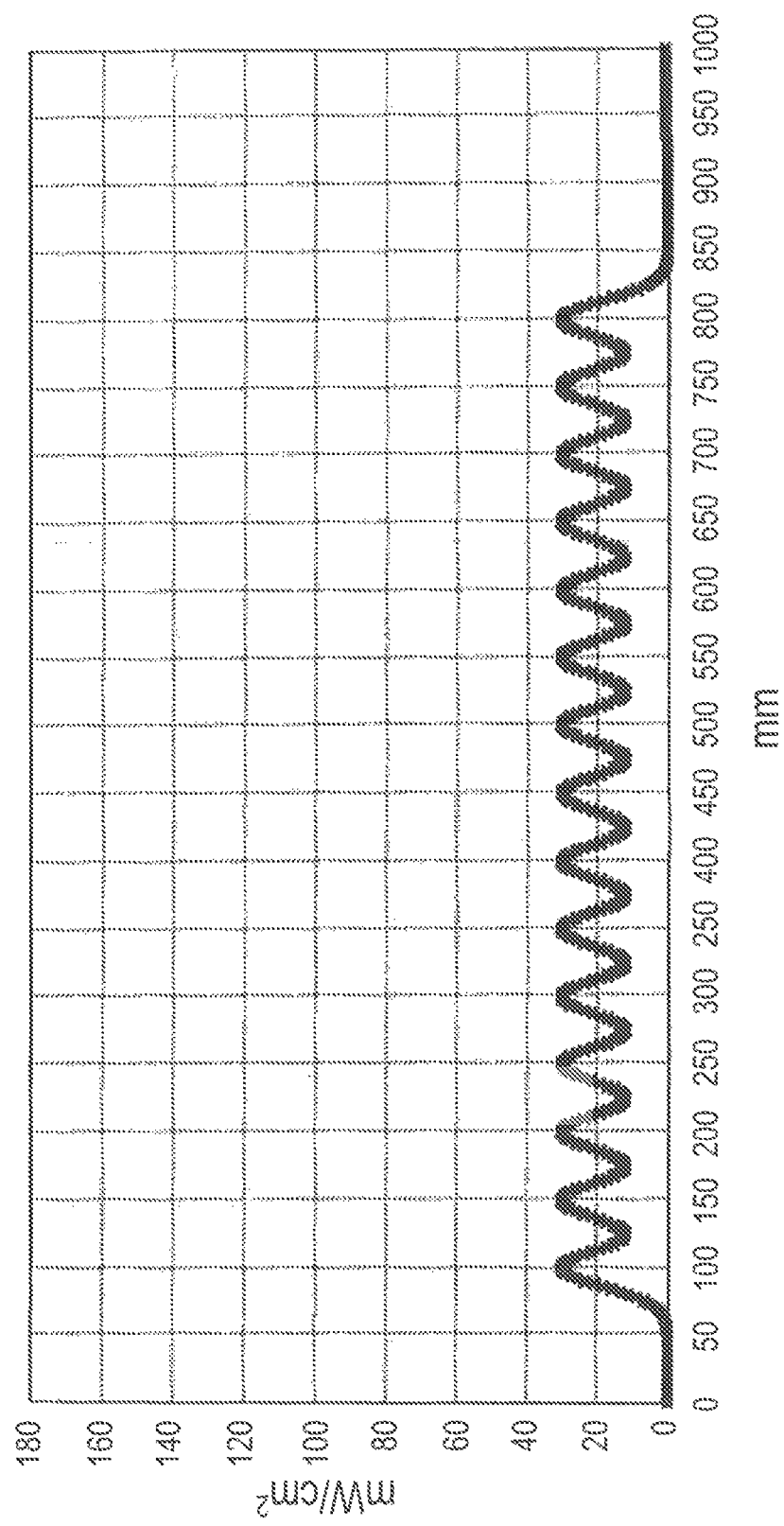
FIG. 9 is a view indicating an example (pattern H) of variation in illuminance received on a coating film surface in the ultraviolet ray irradiation step over time.
Figure 10:
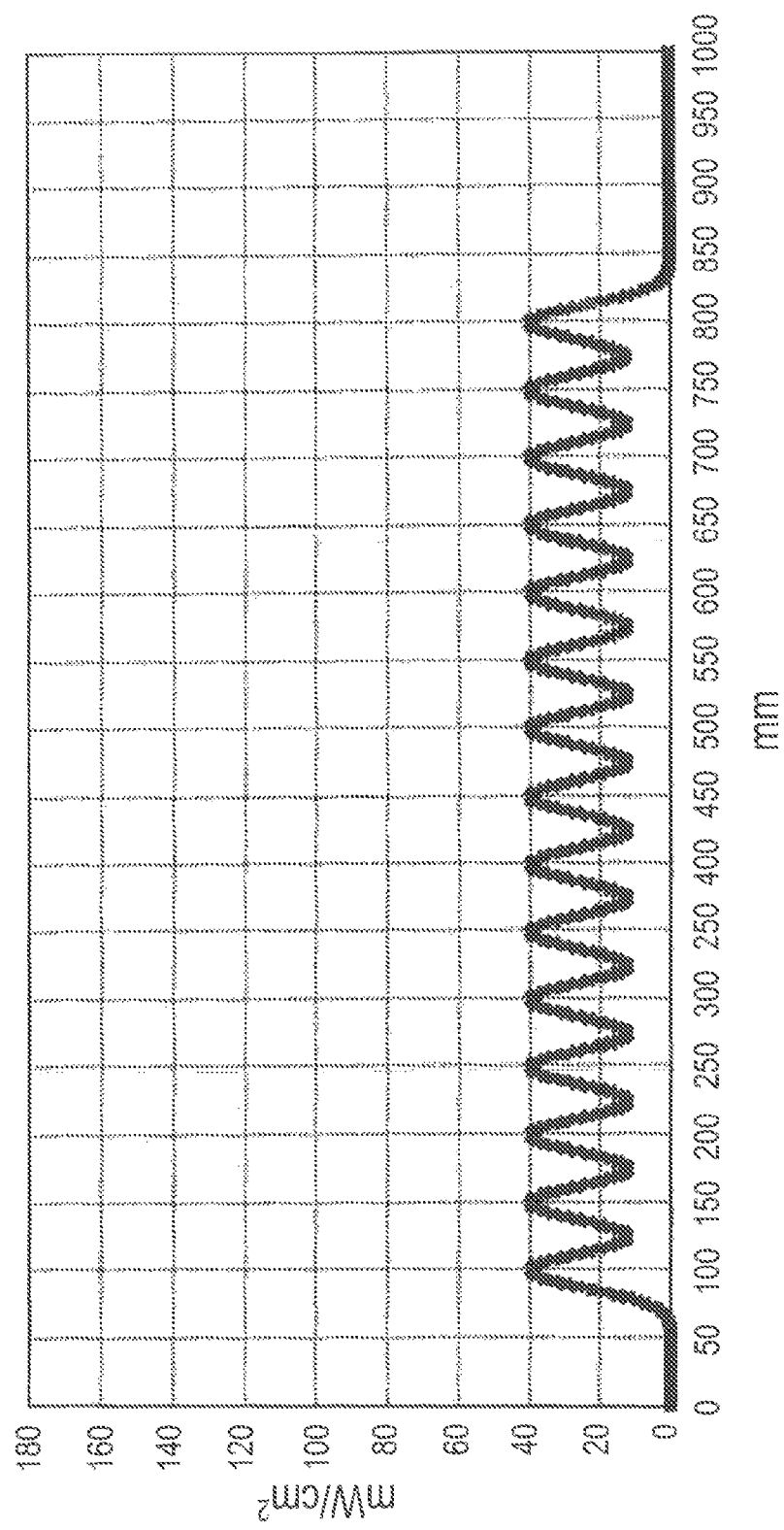
FIG. 10 is a view indicating an example (pattern I) of variation in illuminance received on a coating film surface in the ultraviolet ray irradiation step over time.
Figure 11:
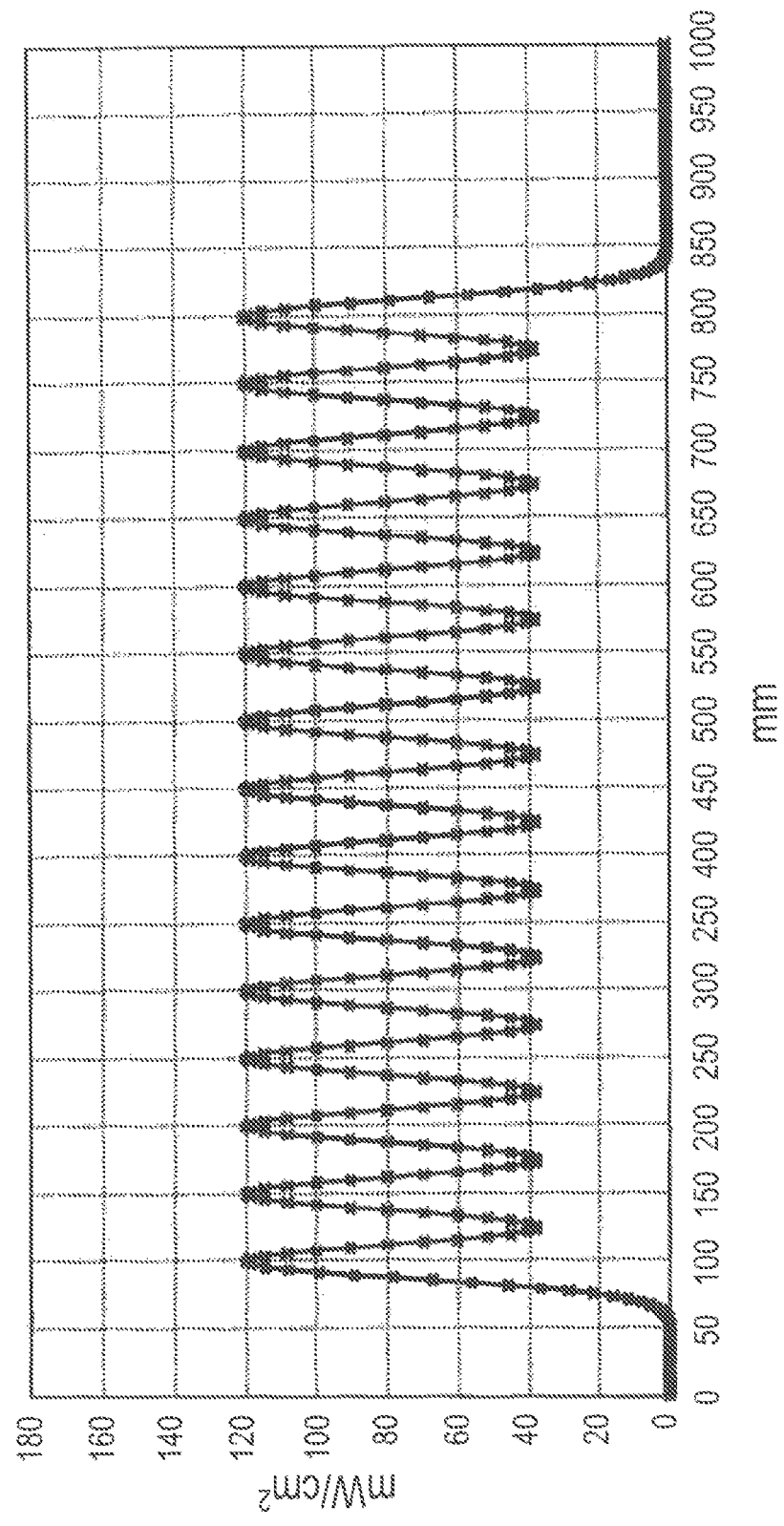
FIG. 11 is a view indicating an example (pattern J) of variation in illuminance received on a coating film surface in the ultraviolet ray irradiation step over time.
Figure 12:
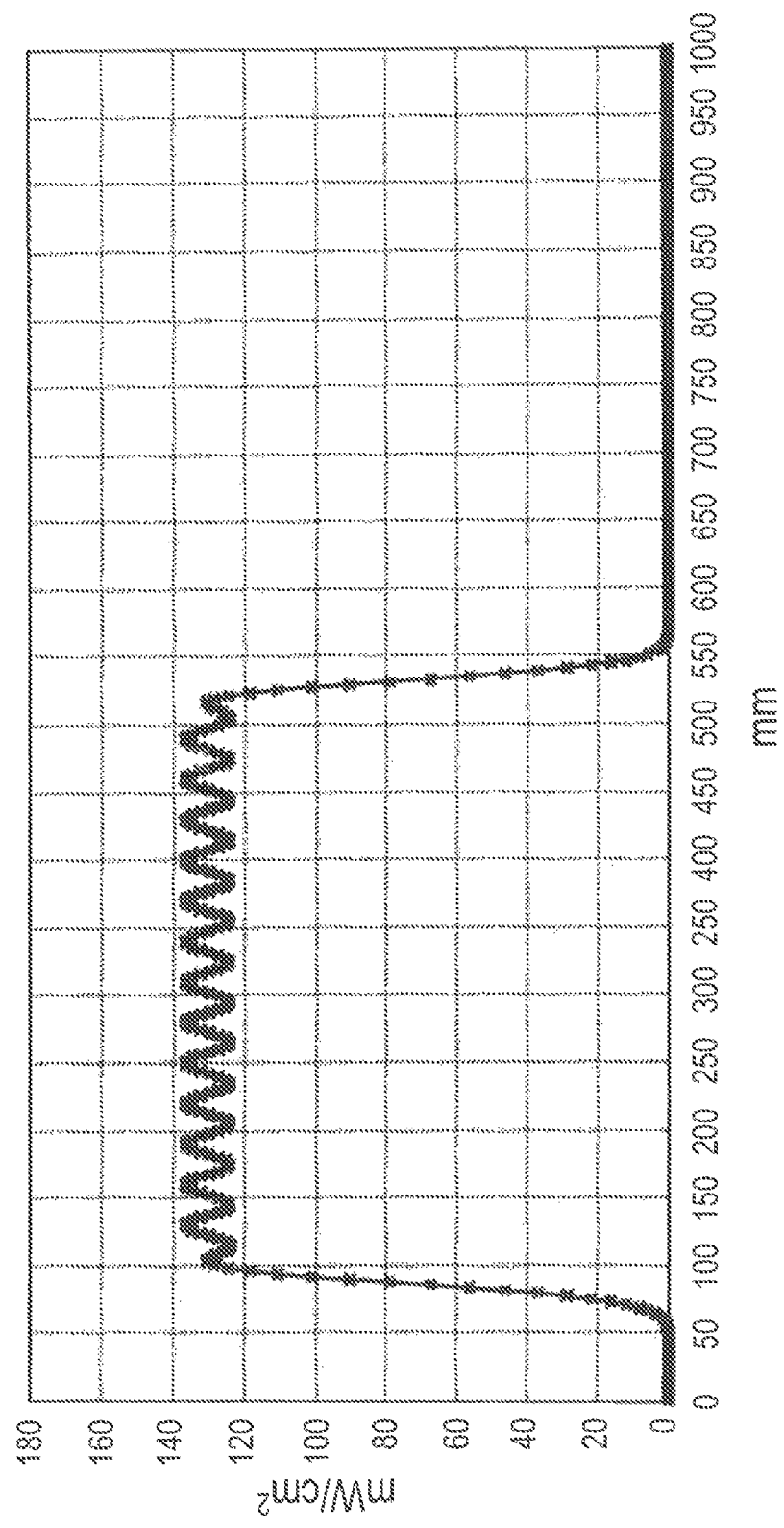
FIG. 12 is a view indicating an example (pattern K) of variation in illuminance received on a coating film surface in the ultraviolet ray irradiation step over time.
Figure 13:
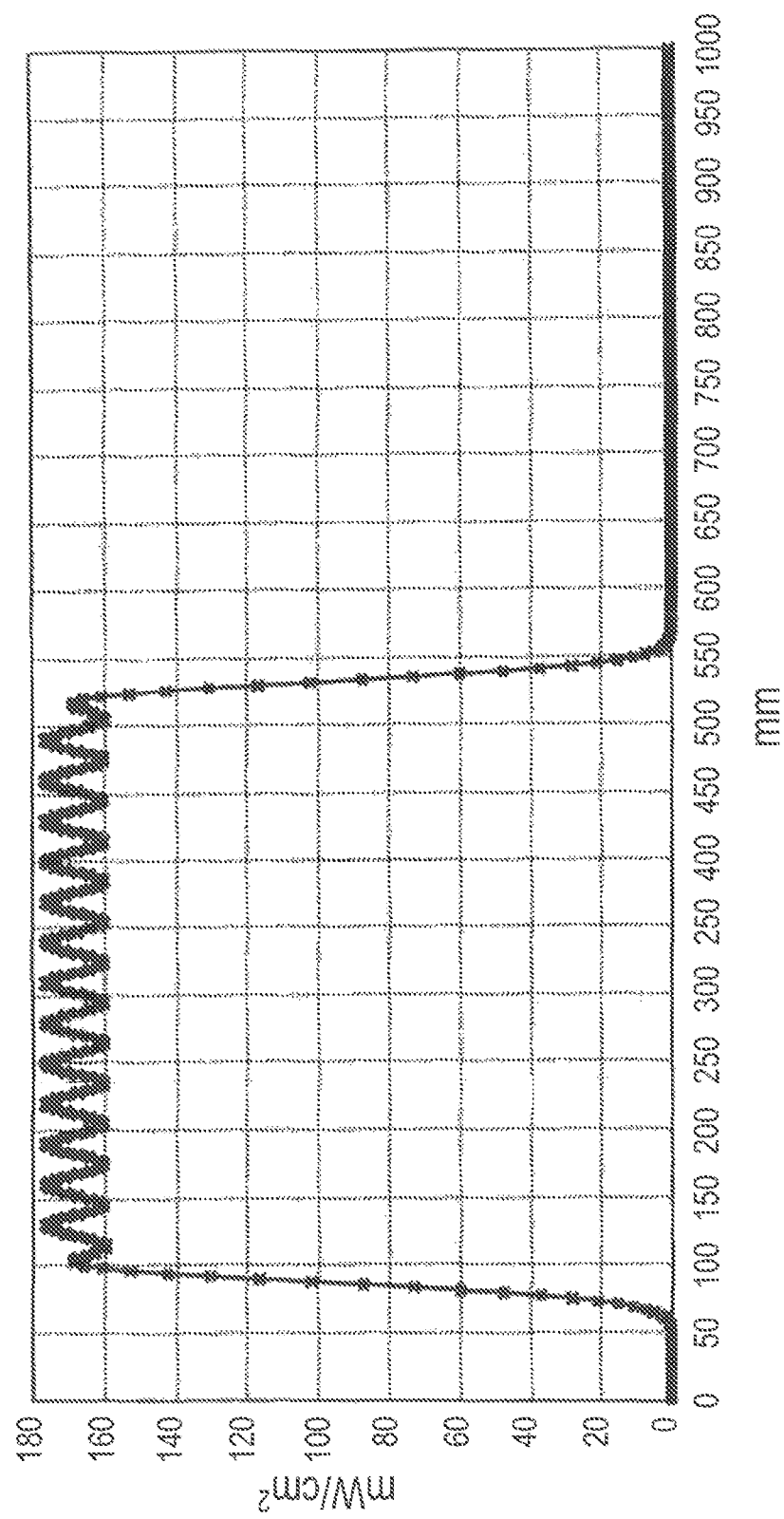
FIG. 13 is a view indicating an example (pattern L) of variation in illuminance received on a coating film surface in the ultraviolet ray irradiation step over time.
Figure 14:
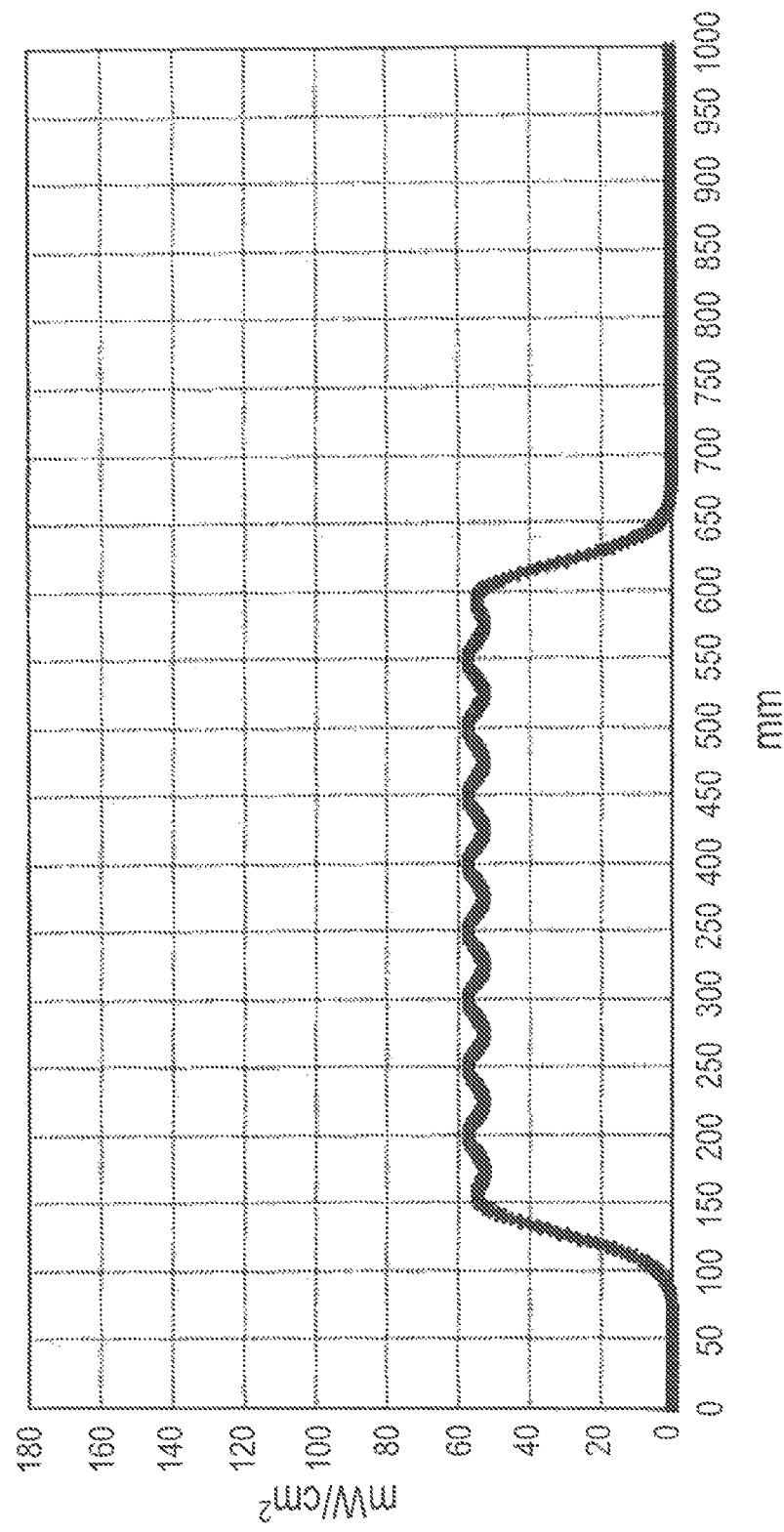
FIG. 14 is a view indicating an example (pattern M) of variation in illuminance received on a coating film surface in the ultraviolet ray irradiation step over time.
Figure 15:
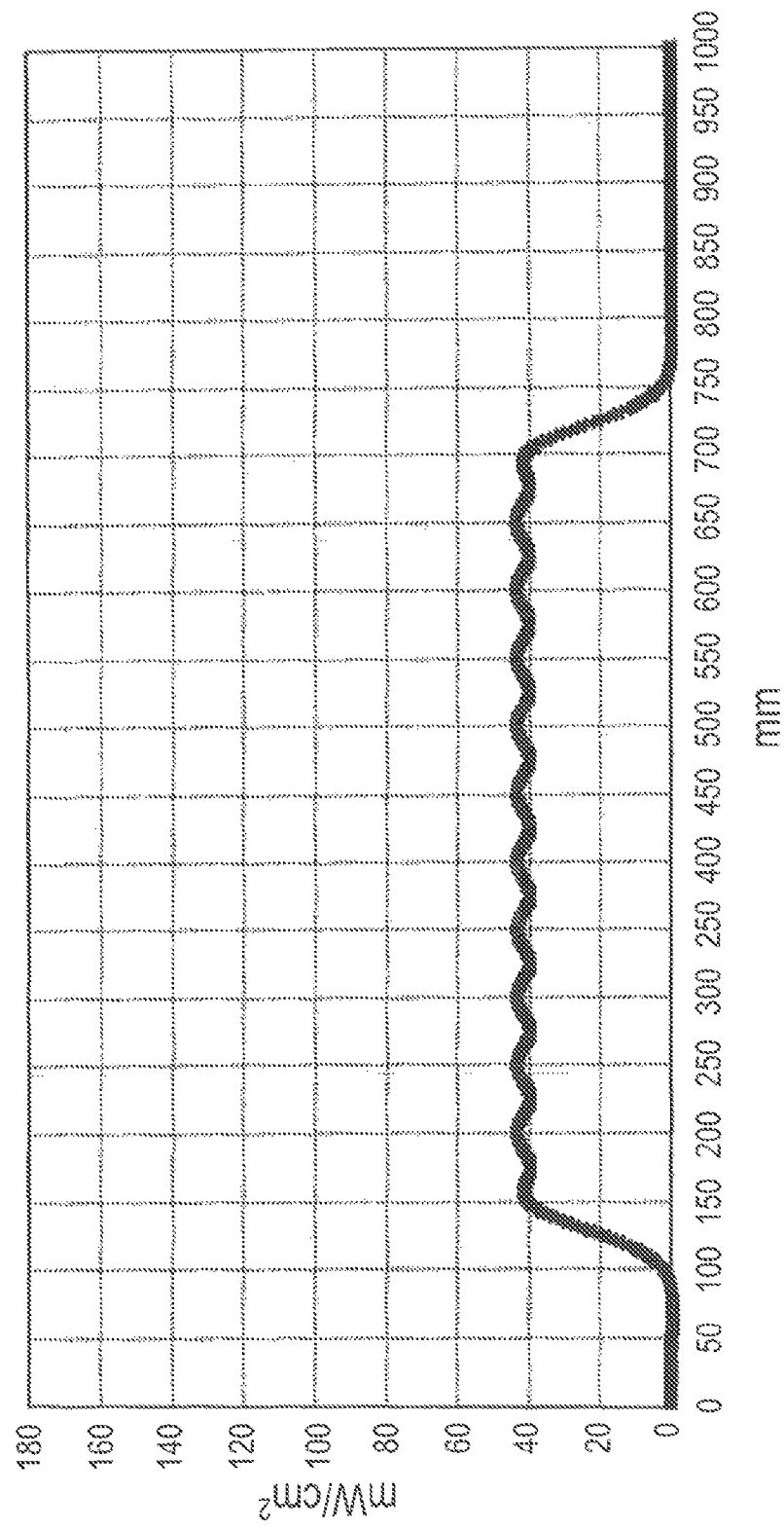
FIG. 15 is a view indicating an example (pattern N) of variation in illuminance received on a coating film surface in the ultraviolet ray irradiation step over time.

A first gas barrier layer a (100 nm) with silicon oxide was formed on the smooth layer surface of the produced base (a) and one surfaces of (b) and (c) by an atmospheric pressure plasma method using an atmospheric pressure plasma film production apparatus (atmospheric pressure plasma CVD apparatus in roll-to-roll form, illustrated in FIG. 3 in Japanese Patent Laid-Open No. 2008-56967) under the following thin film formation conditions. As for the bases (b) and (c), samples on both surfaces of which first gas barrier layers a were formed were also produced. For the samples on both surfaces of which the gas barrier layers were formed, "Both Surfaces" is described in Table 1.

(Mixed Gas Compositions)
Discharge gas: Nitrogen gas 94.9% by volume
Thin film formation gas: Tetraethoxysilane 0.1% by volume
Additive gas: Oxygen gas 5.0% by volume
(Film Formation Conditions)
<First Electrode Side>
Type of power source: Haiden Laboratory 100 kHz (Continuous mode) PHF-6k
Frequency: 100 kHz
Output density: 10 W/cm$^2$
Electrode temperature: 120° C.
<Second Electrode Side>
Type of power source: Pearl Kogyo Co., Ltd., 13.56 MHz, CF-5000-13M
Frequency: 13.56 MHz
Output density: 10 W/cm$^2$
Electrode temperature: 90° C.

The first barrier layer a formed according to the above-described method was constituted by silicon oxide (SiOx).

(Formation of First Gas Barrier Layer b)

A first barrier layer b of silicon oxynitride (50 nm) was formed in the same manner except that the film production conditions in the formation of the first gas barrier layer a were changed as described below.

(Mixed Gas Compositions)
Discharge gas: Nitrogen gas 94.9% by volume
Thin film formation gas: Tetraethoxysilane 0.1% by volume
Additive gas: Hydrogen gas 1.0% by volume
(Film Formation Conditions)
<First Electrode Side>
Type of power source: Haiden Laboratory 100 kHz (Continuous mode) PHF-6k
Frequency: 100 kHz
Output density: 12 W/cm$^2$
Electrode temperature: 120° C.
<Second Electrode Side>
Type of power source: Pearl Kogyo Co., Ltd., 13.56 MHz, CF-5000-13M
Frequency: 13.56 MHz
Output density: 12 W/cm$^2$
Electrode temperature: 90° C.

The resultant first gas barrier layer b was silicon oxynitride (SiOxNy) and had a nitrogen content of 0.8% by element ratio.

(Formation of First Gas Barrier Layer c)

A first gas barrier layer c of silicon oxynitride was formed in the same manner as in the formation of the first gas barrier layer b except that film thickness was 150 nm.

The resultant first gas barrier layer c was silicon oxynitride (SiOxNy) and had a nitrogen content of 0.8% by element ratio.

<<Production of Second Gas Barrier Layer>>

Coating Step and Ultraviolet Ray Irradiation Step

Second gas barrier layers with dried film thicknesses as listed in Table 1 were laminated on first gas barrier layers as described below. For some of comparative samples, the second gas barrier layer was formed on the base ("None" is described for the first barrier layer). Also, each sample on which no second gas barrier layer was formed was produced ("None" is described for the second barrier layer). For each sample on both surfaces of which the second gas barrier layers were formed, "Both Surfaces" is described, in Table 1. The gas barrier films of sample Nos. 1 to 39 listed, in Table 1 and 2 were produced in such a manner.

The ultraviolet ray irradiation step by irradiation with vacuum ultraviolet rays was conducted by the vacuum ultraviolet ray irradiation apparatus of which the schematic view is illustrated as an example in FIG. 1 and the second gas barrier layer was coated with a coating liquid containing a polysilazane compound, described below, on the continuously transported first barrier layer produced as described above so that the dried film thickness was 150 nm using a coater in a pressure reduction extrusion manner (not illustrated).

After the coating, it was dried by a drying apparatus (not illustrated). As drying conditions, drying time was 90 seconds at a transportation rate of 5 m/min, drying temperature was 100° C., and the dew point of a dry atmosphere was adjusted to 5° C.

After the drying, ultraviolet ray irradiation treatment by the irradiation with a vacuum ultraviolet ray, of which an example was illustrated, was carried out. In FIG. 1, reference numeral 1 denotes a substrate, reference numeral 2 denotes a Xe excimer lamp which irradiates a vacuum ultraviolet ray of 172 nm, and reference numeral 3 denotes a holder for the excimer lamp serving as an external electrode. For the details of irradiation conditions such as the number of lamps used for the irradiation with a vacuum ultraviolet ray, an illuminance distribution pattern, the maximum illuminance, and a transportation rate, conditions listed in Tables 1 and 2 were used. The numerical values E1 and E2/E1 are also listed in Table 2. Further, the details of the illuminance distribution patterns A to N are indicated in FIGS. 2 to 15. In FIGS. 2 to 15, the vertical axis indicates the illuminance of a film surface while the horizontal axis indicates the position in the transporting direction (longitudinal direction) of the base.

Reference numeral 4 denotes a chamber for holding a nitrogen atmosphere and the concentration of oxygen in the chamber can be reduced by supplying nitrogen from a dry nitrogen supply port (not illustrated). In the present example, the concentration of oxygen in the chamber was adjusted to 100 ppm or less. Reference numeral 5 denotes a metallic back roll of which the temperature can be controlled. In the present example, the temperature of the back roll was adjusted to 80° C.

The substrate on which the gas barrier layer was formed after the irradiation with the ultraviolet ray was wound up by a wind-up core (not illustrated).

(Preparation of Coating Liquid Containing Polysilazane Compound)

The coating liquid containing a polysilazane compound was prepared by mixing a dibutyl ether solution containing 20 mass % of perhydropolysilazane as a non-catalyst (AQUAMICA NN120-20 manufactured by A2 Electronic Materials) with a 20 mass % dibutyl ether solution of perhydropolysilazane containing an amine catalyst with a solid content of 5 mass % (AQUAMICA NAX120-20, manufactured by AZ Electronic Materials), and an amine catalyst was adjusted to 1 mass % as a solid content and further diluted with dibutyl ether, thereby preparing the coating liquid as a dibutyl ether solution of 5 mass %.

(Apparatus for Producing Sample for Evaluation of Moisture Vapor Barrier Property)

Vapor deposition apparatus: Vacuum deposition apparatus JEE-400, manufactured by JEOL Ltd.

Constant temperature-constant humidity oven: Yamato Humidic Chamber IG47M (Raw Material)

Metal corroded by reaction with water: Calcium (granular)

Moisture vapor impermeable metal: Aluminum (φ3-5 mm, granular)

(Production of Sample for Evaluation of Moisture Vapor Barrier Property)

Metal calcium was evaporated with a size of 12 mm×12 mm through a mask on the surfaces of the gas barrier layers of the produced gas barrier films 1 to 17 using a vacuum deposition apparatus (vacuum deposition apparatus JEE-400, manufactured by JEOL Ltd.). For the sample on both surfaces of which the gas barrier layers were formed, the gas barrier layer surface of the side on which the second gas barrier layer was finally formed was used.

Then, the mask was removed while the vacuum state was maintained, and aluminum was evaporated and temporarily sealed on the whole surface of one side of the sheet. Then, the vacuum state was released and promptly shifted to dried nitrogen atmosphere, quartz glass with a thickness of 0.2 mm was affixed to the aluminum-evaporated surface through a UV curable resin for sealing (manufactured by Nagase ChemteX Corporation), and the resin was cured and adhered to be really sealed by irradiated with ultraviolet light to produce a sample for evaluation of a moisture vapor barrier property.

The obtained samples were stored under high temperature and high humidity of 85° C. and 90% RH and an area with corroded metal calcium based on a metal calcium-deposited area of 12 mm×12 mm was calculated by % expression for each of 20-hour storage, 40-hour storage, and 60-hour storage and evaluated based on the following indices. The results are listed in Tables 1 and 2.

(Evaluation Indices)

Good: An area with corroded metal calcium is less than 1%.

Fair: An area with corroded metal calcium is 1% or more and less than 5%.

Poor: An area with corroded metal calcium is 5% or more.

TABLE 1

| | First Gas Barrier Layer | | Second Gas Barrier Layer/Ultraviolet Ray Irradiation Step Conditions | | | Excimer Lamp | | |
|---|---|---|---|---|---|---|---|---|
| Sample No. | Kind of Base | One Surface/Both Surfaces | Kind of Barrier | One Surface/Both Surfaces | Dried Film Thickness (μm) | Number of Lamps | Center-to-Center Spacing (mm) | Illuminance Distribution Pattern |
| 1 | (a) | One Surface | a | None | — | — | — | — |
| 2 | (a) | One Surface | b | None | — | — | — | — |
| 3 | (a) | One Surface | c | None | — | — | — | — |
| 4 | (a) | None | — | One Surface | 200 | 15 | 50 | A |
| 5 | (a) | One Surface | a | One Surface | 200 | 15 | 50 | A |
| 6 | (a) | One Surface | b | One Surface | 200 | 15 | 50 | A |
| 7 | (a) | One Surface | c | One Surface | 200 | 15 | 50 | A |
| 8 | (a) | One Surface | c | One Surface | 300 | 8 | 100 | B |
| 9 | (a) | One Surface | a | One Surface | 150 | 7 | 50 | C |
| 10 | (a) | One Surface | a | One Surface | 300 | 5 | 150 | D |
| 11 | (a) | One Surface | b | One Surface | 200 | 15 | 50 | E |
| 12 | (a) | One Surface | a | One Surface | 300 | 10 | 75 | F |
| 13 | (a) | One Surface | c | One Surface | 400 | 7 | 50 | G |
| 14 | (a) | One Surface | b | One Surface | 300 | 15 | 50 | H |
| 15 | (a) | One Surface | c | One Surface | 300 | 15 | 50 | I |
| 16 | (a) | One Surface | a | One Surface | 300 | 15 | 50 | J |
| 17 | (a) | One Surface | a | One Surface | 300 | 15 | 30 | K |
| 18 | (a) | One Surface | a | One Surface | 300 | 15 | 30 | L |
| 19 | (a) | One Surface | b | One Surface | 300 | 10 | 50 | M |

TABLE 1-continued

| | First Gas Barrier Layer | | | Second Gas Barrier Layer/Ultraviolet Ray Irradiation Step Conditions | | | | |
|---|---|---|---|---|---|---|---|---|
| | | | | | | Excimer Lamp | | |
| Sample No. | Kind of Base | One Surface/Both Surfaces | Kind of Barrier | One Surface/Both Surfaces | Dried Film Thickness (μm) | Number of Lamps | Center-to-Center Spacing (mm) | Illuminance Distribution Pattern |
| 20 | (a) | One Surface | c | One Surface | 300 | 12 | 50 | N |
| 21 | (a) | One Surface | b | One Surface | 200 | 15 | 50 | A |
| 22 | (b) | One Surface | c | One Surface | 200 | 15 | 50 | A |
| 23 | (b) | One Surface | a | One Surface | 150 | 7 | 50 | C |
| 24 | (b) | Both Surfaces | b | None | — | — | — | — |
| 25 | (b) | Both Surfaces | b | Both Surfaces | 300 | 15 | 50 | E |
| 26 | (c) | One Surface | b | One Surface | 300 | 15 | 30 | K |
| 27 | (c) | Both Surfaces | c | None | — | — | — | — |
| 28 | (c) | Both Surfaces | c | Both Surfaces | 160 | 10 | 50 | M |
| 29 | (c) | None | — | Both Surfaces | 300 | 15 | 50 | A |

TABLE 2

| | Second Gas Barrier Layer/Ultraviolet Ray Irradiation Step Conditions | | | | | | Evaluation of Moisture Vapor Barrier Property | | | |
|---|---|---|---|---|---|---|---|---|---|---|
| Sample No. | Rate (%) of Time of Period T | Coating Film Surface Illuminance (mW/cm$^2$) | Transportation Rate (m/min) | E1 (mJ/cm$^2$) | E2 (mJ/cm$^2$) | E2/E1 | 20 h | 40 h | 60 h | Remarks |
| 1 | — | — | — | — | — | — | Poor | Poor | Poor | Comparative Example |
| 2 | — | — | — | — | — | — | Poor | Poor | Poor | Comparative Example |
| 3 | — | — | — | — | — | — | Fair | Poor | Poor | Comparative Example |
| 4 | 71 | 90 | 2.5 | 1024 | 194 | 0.19 | Fair | Poor | Poor | Comparative Example |
| 5 | 71 | 90 | 2.5 | 1024 | 194 | 0.19 | Good | Good | Good | The Present Invention |
| 6 | 71 | 90 | 2.5 | 1024 | 194 | 0.19 | Good | Good | Good | The Present Invention |
| 7 | 71 | 90 | 2.5 | 1024 | 194 | 0.19 | Good | Good | Good | The Present Invention |
| 8 | 33 | 90 | 5.0 | 237 | 88 | 0.37 | Good | Fair | Fair | The Present Invention |
| 9 | 65 | 90 | 5.0 | 236 | 48 | 0.20 | Good | Fair | Fair | The Present Invention |
| 10 | 23 | 90 | 5.0 | 149 | 55 | 0.37 | Fair | Poor | Poor | Comparative Example |
| 11 | 85 | 69 | 5.0 | 574 | 22 | 0.04 | Good | Good | Fair | The Present Invention |
| 12 | 35 | 60 | 5.0 | 196 | 202 | 1.03 | Good | Fair | Fair | The Present Invention |
| 13 | 72 | 69 | 5.0 | 256 | 22 | 0.08 | Good | Good | Good | The Present Invention |
| 14 | 0 | 30 | 5.0 | 0 | 190 | — | Poor | Poor | Poor | Comparative Example |
| 15 | 0 | 40 | 1.3 | 0 | 902 | — | Fair | Poor | Poor | Comparative Example |
| 16 | 69 | 120 | 5.0 | 604 | 100 | 0.17 | Good | Good | Good | The Present Invention |
| 17 | 88 | 136 | 2.5 | 1391 | 17 | 0.01 | Good | Good | Good | The Present Invention |
| 18 | 8 | 176 | 5.0 | 56 | 854 | 15.37 | Fair | Fair | Poor | Comparative Example |
| 19 | 77 | 58 | 5.0 | 305 | 26 | 0.08 | Good | Good | Fair | The Present Invention |
| 20 | 0 | 44 | 2.5 | 0 | 604 | — | Fair | Poor | Poor | Comparative Example |
| 21 | 71 | 90 | 1.3 | 1969 | 374 | 0.19 | Fair | Fair | Poor | Comparative Example |
| 22 | 71 | 90 | 2.5 | 1024 | 194 | 0.19 | Good | Good | Good | The Present Invention |
| 23 | 65 | 90 | 5.0 | 236 | 48 | 0.20 | Good | Fair | Fair | The Present Invention |

TABLE 2-continued

| | Second Gas Barrier Layer/Ultraviolet Ray Irradiation Step Conditions | | | | | | Evaluation of Moisture Vapor Barrier Property | | | |
|---|---|---|---|---|---|---|---|---|---|---|
| Sample No. | Rate (%) of Time of Period T | Coating Film Surface Illuminance (mW/cm$^2$) | Transportation Rate (m/min) | E1 (mJ/cm$^2$) | E2 (mJ/cm$^2$) | E2/E1 | 20 h | 40 h | 60 h | Remarks |
| 24 | — | — | — | — | — | — | Poor | Poor | Poor | Comparative Example |
| 25 | 85 | 69 | 5.0 | 574 | 22 | 0.04 | Good | Good | Good | The Present Invention |
| 26 | 88 | 136 | 2.5 | 1391 | 17 | 0.01 | Good | Good | Good | The Present Invention |
| 27 | — | — | — | — | — | — | Fair | Fair | Poor | Comparative Example |
| 28 | 77 | 56 | 5.0 | 305 | 26 | 0.08 | Good | Good | Good | The Present Invention |
| 29 | 71 | 90 | 2.5 | 1024 | 194 | 0.19 | Fair | Fair | Poor | Comparative Example |

E1: Integrated irradiation energy E1 (50 mW/cm$^2$ or more and 160 mW/cm$^2$ or less)
E2: Integrated irradiation energy E2 (less than 50 mW/cm$^2$ or more than 160 mW/cm$^2$)

As listed in Tables 1 and 2, it is found that the method for producing a gas barrier film of the present invention provides a gas barrier film having a high barrier property and has high productivity.

(Evaluation of Heat Resistance of Gas Barrier Film)

The gas barrier films listed in Table 3 were subjected to heat, treatment at 220° C. for 10 minutes under air atmosphere. In this case, the surfaces of the gas barrier layers of the gas barrier films (sites to be used as samples for evaluation of moisture vapor barrier properties as described belong were held so that a member did not contact with them. After the heat treatment, they were taken out in atmospheric air at room temperature and cooled to the room temperature without being processed. Then, samples for evaluation of moisture vapor barrier properties were produced in the same manner as described above to carry errs the evaluations of the moisture vapor barrier properties. The results are listed in Table 3.

TABLE 3

| Sample No. | Evaluation of Moisture Vapor Barrier Property after Heat Treatment | | | Remarks |
|---|---|---|---|---|
| | 20 h | 40 h | 60 h | |
| 22 | Good | Good | Good | The Present Invention |
| 23 | Good | Fair | Poor | The Present Invention |
| 24 | Poor | Poor | Poor | Comparative Example |
| 25 | Good | Good | Good | The Present Invention |
| 26 | Good | Good | Good | The Present Invention |
| 27 | Fair | Poor | Poor | Comparative Example |
| 28 | Good | Good | Good | The Present Invention |
| 29 | Good | Fair | Poor | Comparative Example |

As listed in Table 3, it is found that a gas barrier film which is excellent in heat resistance and has a high barrier property and high productivity is obtained by the method for producing a gas barrier film of the present invention.

Example 2

<Evaluation as Gas Barrier Film for Organic Thin Film Electronic Device>

Organic EL elements which were organic thin film electronic devices were produced using gas barrier films as listed in Table 4 as sealing films. They were subjected to accelerated aging treatment for 400 hours under an environment of 60° C. and 90% RH to evaluate gas barrier performance and its stability by comparison with performance prior to the accelerated aging.

(Evaluation of Organic EL Element)

For the evaluation, each element was ranked according to the following criteria. A practicable range is good or better.

(Evaluation of Black Specks)

An electric current of 1 mA/cm$^2$ was applied to each sample and light was continuously emitted for 24 hours, followed by magnifying a part of a panel by a 100-time microscope (MS-804 manufactured by Moritex Corporation, lens MP-ZE25-200) to be photographed. A captured image was out into a 2 mm square part, visual observation was carried out, the state of black specks was examined, an element deterioration rate was calculated, and ranking was carried out as described below. The results are listed in Table 4.

Deterioration rate=area of black specks generated in element prior to accelerated aging treatment/area of black specks generated in element after accelerated aging treatment×100(%)

Excellent: 90% or more
Good: 60% or more and less than 90%
Fair: 20% or more and less than 60%
Poor: less than 20%

<Production of Organic EL Element>

ITO (indium tin oxide) with a thickness of 150 nm was formed on the inorganic layer of each gas barrier film by a sputtering method and patterned by a photolithography method to form a first electrode layer. In addition, the pattern was made to have a 50 mm square light-emitting area.

<Formation of Hole Transport Layer>

A coating liquid for forming a hole transport layer described below was coated on the first electrode layer of each gas barrier film, on which the first electrode layer was formed, by an extrusion coating machine and thereafter dried to form a hole transport layer. The coating liquid for forming a hole transport layer was coated so that the thickness after drying was 50 nm.

Prior to coating the coating liquid for forming a hole transport layer, the cleaning surface modification treatment of the gas barrier film was carried out using a low-pressure mercurylamp with a wavelength of 184.9 nm at an irradiation intensity of 15 mW/cm² and a distance of 10 mm. Charge elimination treatment was carried out using a static eliminator with feeble X-rays.

(Coating Conditions)

A coating step was carried out in an environment at 25° C. and a relative humidity of 50% in atmospheric air.

(Preparation of Coating Liquid for Forming Hole Transport Layer)

A solution in which polyethylenedioxythiophene/polystyrene sulfonate (PEDOT/PSS, Bytron PAI 4083 manufactured by Bayer) was diluted with 65% pure water and 5% methanol was prepared as a coating liquid for forming a hole transport layer.

(Drying and Heat Treatment Conditions)

After coating the coating liquid for forming a hole transport layer, a solvent was removed with a height of 100 mm, a discharge wind speed of 1 m/s, a widthwise wind speed distribution of 5%, and a temperature 100° C. toward a produced film surface, followed by subsequently carrying out heat treatment in a back surface heat transfer system at a temperature 150° C. using a heat treatment apparatus to form a hole transport layer.

<Formation of Light-Emitting Layer>

Subsequently, a coating liquid for forming a white light-emitting layer described below was coated on the hole transport layer of the gas barrier film 1, on which even the hole transport layer was formed, by an extrusion coating machine, and thereafter dried to form a light-emitting layer. The coating liquid for forming a white light-emitting layer was coated so that the thickness after drying was 40 nm.

(Coating Liquid for Forming White Light-Emitting Layer)

In 100 g of toluene, 1.0 g of a host material H-A, 100 mg of a dopant material D-A, 0-2 mg of a dopant material D-B, and 0.2 mg of a dopant material D-C were dissolved to prepare the resultant as a coating liquid for forming a white light-emitting layer.

[Formula 1]

H-A

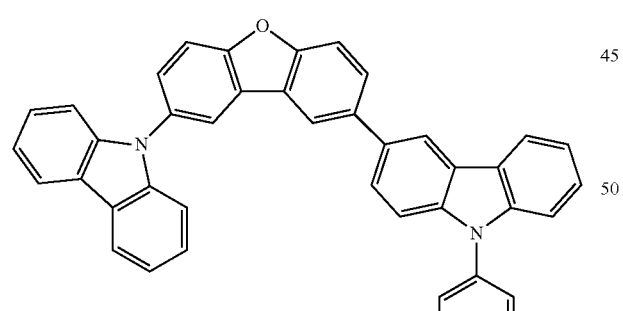

D-A

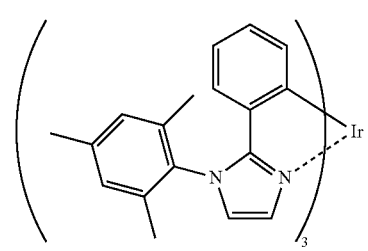

D-B

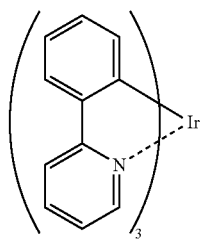

D-C

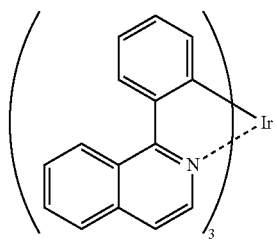

(Coating Conditions)

A coating step was carried out at a coating temperature of 25° C. and a coating speed of 1 m/min in an atmosphere with a nitrogen gas concentration of 99% or more.

(Drying and Heat Treatment Conditions)

After coating the coating liquid for forming a white light-emitting layer, a solvent was removed with a height of 100 mm, a discharge wind speed of 1 m/s, a widthwise wind speed distribution of 5%, and a temperature 60° C. toward a produced film surface, followed by subsequently carrying out heat treatment at a temperature 130° C. to form a light-emitting layer.

(Formation of Electron Transport Layer)

Subsequently, after the formation of the light-emitting layer, a coating liquid for forming an electron transport layer described below was coated by an extrusion coating machine, and thereafter dried to form an electron transport layer. The coating liquid for forming an electron transport layer was coated so that the thickness after drying was 30 mm.

(Coating Conditions)

A coating step was carried out at the coating temperature of the coating liquid for forming an electron transport layer of 25° C. and a coating speed of 1 m/min in an atmosphere with a nitrogen gas concentration of 99% or more.

(Coating Liquid for Forming Electron Transport Layer)

As for the electron transport layer, E-A was dissolved in 2,2,3,3-tetrafluoro-1-propanol to make a 0.5 mass % solution as the coating liquid for forming an electron transport layer.

[Formula 2]

E-A

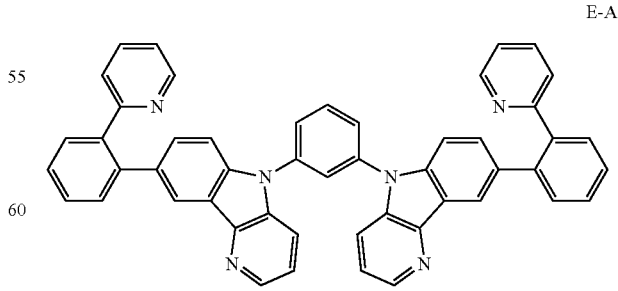

(Drying and Heat Treatment Conditions)

After coating the coating liquid for forming an electron transport layer, a solvent was removed with a height of 100 mm, a discharge wind speed of 1 m/s, a widthwise wind speed distribution of 5%, said a temperature 60° C. toward a produced film surface, followed by subsequently carrying out heat treatment as a temperature 200° C. in a heat treatment portion to form an electron transport layer.

(Formation of Electron Injection Layer)

Subsequently, an electron injection layer was formed, on the formed electron transport layer. First, a substrate was put into a pressure reduction chamber and a pressure was reduced to $5\times10^{-4}$ Pa. Cesium fluoride previously prepared on a vapor deposition boat made of tantalum in a vacuum chamber was heated to form the electron injection layer with a thickness of 3 nm.

(Formation of Second Electrode)

Subsequently, a portion to be an extraction electrode on the first electrode on the formed electron injection layer was removed, a mask pattern was formed on the formed electron injection layer to have a 50 mm square light-emitting area by a vapor deposition method to have an extraction electrode using aluminum as a second electrode formation material under a vacuum of $5\times10^{-4}$ Pa, and a second electrode with a thickness of 100 nm was laminated.

(Cutting)

The gas barrier film 1 on which even the second electrode was formed was moved to a nitrogen atmosphere again and was cut in a specified size to produce an organic EL element.

(Cutting Method)

A cutting method, without particular limitation, is preferably carried out by ablation processing with a high energy laser such as an ultraviolet laser (e.g., wavelength of 266 nm), an infrared laser, or a carbon dioxide gas laser. Since a gas barrier film has an inorganic thin film which is easily broken, a crack may be generated in a cut detail when the gas barrier film is cut with an ordinary cutter. A similar case occurs not only in the cutting of an element but also in the cutting of the gas barrier film alone. Furthermore, disposition of a protective layer containing an organic component in the surface of the inorganic layer can also suppress crazing during cutting.

(Electrode Lead Connection)

A flexible printed circuit board (base film: polyimide or 12.5 μm, rolled copper foil of 18 μm, cover lay: polyimide of 12.5 μm, surface treatment NiAu plating) was connected to the produced organic EL element rising an anisotropic conductive film DP3232S9, manufactured by Sony Chemical & Information Device Corporation.

Crimping was conducted under crimping conditions: a temperature 170° C. (ACF temperature of 140° C. measured separately using a thermo-electric pile), a pressure of 2 MPa, and 10 seconds.

(Sealing)

A sealing member was adhered to the organic EL element, to which the electrode lead (flexible printed circuit board) was connected, using a commercially available roll laminator, and an organic EL element 101 was produced.

In addition, as the sealing member, there was used a member in which a polyethylene terephthalate (PET) film (with a thickness of 12 μm) was laminated on aluminum foil with, thickness of 30 μm (manufactured by Toyo Aluminum K.K.) using an adhesive for dry lamination (two liquid reaction type urethane-based adhesive) (the thickness of the adhesive layer of 1.5 μm).

An aluminum surface was coated uniformly with a thermosetting adhesive with a thickness of 20 μm along the adhesive surface (gloss surface) of the aluminum foil using a dispenser.

The following epoxy adhesives were used for the thermosetting adhesive.

Bisphenol-A diglycidyl ether (DGEBA)
Dicyandiamide (DICY)
Epoxy adduct curing accelerator Thereafter, a sealing substrate was brought into intimate contact and placed to cover a junction between the extraction electrode and the electrode lead and was brought into intimate contact and sealed using a crimping roller under crimping conditions: a crimping roller temperature of 120° C., a pressure of 0.5 MPa, and an apparatus rate of 0.3 m/min.

TABLE 4

| Sample No. | Evaluation of Organic EL Element | Remarks |
| --- | --- | --- |
| 3 | Poor | Comparative Example |
| 4 | Poor | Comparative Example |
| 7 | Excellent | The Present Invention |
| 8 | Fair | The Present Invention |
| 13 | Good | The Present Invention |
| 15 | Poor | Comparative Example |
| 20 | Poor | Comparative Example |
| 22 | Excellent | The Present Invention |
| 23 | Fair | The Present Invention |
| 24 | Poor | Comparative Example |
| 25 | Excellent | The Present Invention |
| 26 | Excellent | The Present Invention |
| 27 | Poor | Comparative Example |
| 28 | Excellent | The Present Invention |
| 29 | Poor | Comparative Example |

As listed in Table 4, it is found that, as for a barrier film produced by the method for producing a gas barrier film of the present invention, the gas barrier film having a nigh barrier property is obtained and has high productivity.

REFERENCE SIGNS LIST

1 Base
2 Excimer lamp
3 Excimer lamp holding member (external electrode)
4 Irradiation chamber
5 Back roll
11 Vacuum chamber
12, 13 Film formation roll
14 Unwind roll
15 Facing space is wind-up roll
17 Wind-up roll
18 Film formation gas supply pipe
19 Vacuum exhaust port
20 Vacuum pump
101 Plasma CVD apparatus
102 Vacuum rank
103 Cathode electrode
105 Susceptor
106 Heat medium circulating system
107 Vacuum pumping system
108 Gas introduction system
109 High frequency power source
160 Heating cooling apparatus

What is claimed is:

1. A method for producing a gas barrier film, whereby a gas barrier film which has a first gas barrier layer formed on a base by a chemical vapor deposition method and has a second gas barrier layer on the first gas barrier layer is produced, the method comprising:
a coating step for coating the first gas barrier layer formed on the belt-shaped base with a coating liquid containing a polysilazane compound to form a coating film; and an ultraviolet ray irradiation step for using a plurality of light sources of a vacuum ultraviolet ray (VUV) which face the base and have a distribution of an illuminance within ±10% on a straight line from one point of a first side to one point of a second side along the longitudinal direction of the base, moving the base, on which the coating film is formed, relatively with respect to the light sources, and irradiating the coating film with a vacuum ultraviolet ray to form the second gas barrier layer, wherein, in the ultraviolet ray irradiation step, an illuminance of the vacuum ultraviolet ray received on a coating film surface by the coating film which moves relatively with respect to the light sources from start to end of the irradiation with the vacuum ultraviolet ray, is 160 mW/cm$^2$ or less, there is a period T during which an illuminance of the vacuum ultraviolet ray on the coating film surface is 50 mW/cm$^2$ or more and 160 mW/cm$^2$ or less, and an amount of energy (E1) of a vacuum ultraviolet ray received on the coating film surface within the period T is 180 mJ/cm$^2$ or more and 1800 mJ/cm$^2$ or less.

2. The method for producing a gas barrier film according to claim 1, wherein, in the ultraviolet ray irradiation step, a ratio (E2/E1) of an amount of energy (E2) of a vacuum ultraviolet ray received on the coating film surface during a period other than the period T to the E1 is 0 or more and 0.25 or less.

3. The method for producing a gas barrier film according to claim 1, wherein a time of the period T is 30% or more of a time of a total period Z of the ultraviolet ray irradiation step.

4. The method for producing a gas barrier film according to claim 3, wherein a time of the period T is 70% or more of a time of a total period Z of the ultraviolet ray irradiation step.

5. The method for producing a gas barrier film according to claim 4, wherein the period T is just one in the ultraviolet ray irradiation step.

6. The method for producing a gas barrier film according to claim 1, wherein the step of irradiating includes converting at least one part of the polysilazane compound into silicon oxide to form the second gas barrier layer.

* * * * *